(12) United States Patent
Kishimoto

(10) Patent No.: US 7,593,442 B2
(45) Date of Patent: Sep. 22, 2009

(54) SEMICONDUCTOR LASER DEVICE, SEMICONDUCTOR LASER DEVICE MANUFACTURING METHOD, OPTICAL DISK APPARATUS AND OPTICAL TRANSMISSION SYSTEM

(75) Inventor: Katsuhiko Kishimoto, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 498 days.

(21) Appl. No.: 11/210,792

(22) Filed: Aug. 25, 2005

(65) Prior Publication Data
US 2006/0067374 A1 Mar. 30, 2006

(30) Foreign Application Priority Data
Aug. 26, 2004 (JP) .......................... P2004-246542
Jun. 20, 2005 (JP) .......................... P2005-179330

(51) Int. Cl.
*H01S 3/00* (2006.01)
*H01S 5/00* (2006.01)

(52) U.S. Cl. ............................... 372/38.05; 372/43.01
(58) Field of Classification Search .............. 372/38.05, 372/43.01, 87
See application file for complete search history.

(56) References Cited

U.S. PATENT DOCUMENTS

| | | | | |
|---|---|---|---|---|
| 5,331,655 A | * | 7/1994 | Harder et al. | 372/45.01 |
| 6,067,309 A | * | 5/2000 | Onomura et al. | 372/46.01 |
| 6,757,311 B2 | * | 6/2004 | Abe | 372/43.01 |
| 6,998,649 B2 | * | 2/2006 | Hata | 257/99 |
| 2002/0191658 A1 | * | 12/2002 | Capasso et al. | 372/45 |
| 2003/0039286 A1 | * | 2/2003 | Doi et al. | 372/45 |
| 2005/0030999 A1 | * | 2/2005 | Yoneda | 372/46 |
| 2005/0127391 A1 | * | 6/2005 | Yanamoto | 257/103 |
| 2005/0213628 A1 | * | 9/2005 | Kishimoto et al. | 372/46.01 |
| 2005/0226295 A1 | * | 10/2005 | Taneya et al. | 372/45.01 |
| 2005/0281304 A1 | * | 12/2005 | Mochida | 372/46.01 |
| 2006/0131604 A1 | * | 6/2006 | Kozaki | 257/103 |
| 2006/0138431 A1 | * | 6/2006 | Dwilinski et al. | 257/79 |

FOREIGN PATENT DOCUMENTS

| | | |
|---|---|---|
| JP | 62-266890 A | 11/1987 |
| JP | 4-111375 A | 4/1992 |
| JP | 2000-164928 A | 6/2000 |

\* cited by examiner

*Primary Examiner*—Minsun Harvey
*Assistant Examiner*—Phillip Nguyen
(74) *Attorney, Agent, or Firm*—Birch, Stewart, Kolasch & Birch, LLP

(57) ABSTRACT

In the semiconductor laser device of the present invention, a p-side electrode 115 formed on a second conductive type semiconductor layer group of the layers 108 through 114 includes an Ag layer 115*a*, a Pd layer 115*b* and an Au layer 115*c* in order from the side in contact with the second conductive type semiconductor layer group of the layers 108 through 114. The refractive index of the Ag layer 115*a* is sufficiently smaller than the refractive index of the semiconductor material used for the semiconductor layer group of the layers 108 through 114. Therefore, the oscillation laser light can be confined in the semiconductor layer group of the layers 108 through 114 without leaking toward the p-side electrode 115.

13 Claims, 11 Drawing Sheets

SEMICONDUCTOR LASER DEVICE, SEMICONDUCTOR LASER DEVICE MANUFACTURING METHOD, OPTICAL DISK APPARATUS AND OPTICAL TRANSMISSION SYSTEM

The present non-provisional application declares priority based on JP 2004-246542 applied for patent in Japan on Aug. 26, 2004 and JP 2005-179330 applied for patent in Japan on Jun. 20, 2005 under U.S. Code, Volume 35, Chapter 119(a). The disclosures of the applications are fully incorporated herein by reference.

BACKGROUND OF THE INVENTION

The present invention relates to a semiconductor laser device and a manufacturing method therefor and relates typically to a semiconductor laser device used suitably for an optical disk apparatus and an optical transmission module section of an optical transmission system and a manufacturing method therefor.

The present invention further relates to an optical disk apparatus and an optical transmission system provided with such a semiconductor laser device.

Semiconductor laser devices are widely used for optical disk apparatuses, optical transmission systems and the like. Among others, a semiconductor laser device called a buried ridge type has a high reliability and is known as a semiconductor laser device capable of operating with low power consumption (low threshold current). However, the buried ridge type semiconductor laser device must be manufactured through complicated processes requiring a second-time crystal growth process for forming a current constriction layer and a third-time crystal growth process for forming a contact layer in addition to a first-time crystal growth process carried out for forming a semiconductor layer that includes an active layer and a cladding layer in the manufacturing processes. The above therefore has led to the problems of degraded yield and high manufacturing cost.

Accordingly, there is a ridge waveguide type semiconductor laser device, which has a ridge portion on its active layer and is able to be manufactured through one-time crystal growth process (refer to JP H04-111375 A) as a conventional semiconductor laser device that can be manufactured more simply at lower cost.

FIG. 11 is a schematic sectional view of the conventional semiconductor laser device. The conventional semiconductor laser device is manufactured as follows.

First of all, an n-type InGaP cladding layer 402, an InGaAs/GaAs strained quantum well active layer 403, a p-type InGaP cladding layer 404 and a p-type InGaAs contact layer 405 are successively layered on an n-type GaAs substrate 401 by the MOCVD (metal-organic chemical vapor deposition) method. The p-type InGaP cladding layer 404 is etched partway by a photolithography technique or the like to form a mesa that becomes a ridge portion, and thereafter, Ti/Pt/Au and Au—Ge—Ni/Au are successively deposited as a p-electrode 406 and an n-electrode 407, respectively.

If a current is flowed through the device manufactured as described above, a Schottky junction portion 408 is formed between the p-type InGaP cladding layer 404 and the p-electrode 406, and a current flows only between the p-electrode 406 and the p-type InGaAs contact layer 405, effecting current constriction.

In contrast to the buried ridge type semiconductor laser device that requires the complicated manufacturing processes of three times of crystal growth processes in total as described above, the conventional ridge waveguide type semiconductor laser device is required to undergo only one-time crystal growth process. In addition, the conventional semiconductor laser device, which has a construction that achieves current constriction by using the Schottky junction different from the generally called air ridge type that employs an inorganic insulator for current constriction and belongs to the ridge waveguide type semiconductor laser devices, has thus a simpler structure and is manufacturable at lower cost.

However, it has been discovered that the conventional semiconductor laser device of JP H04-111375 A has had the following problems. That is, differently from the buried ridge type semiconductor laser device and the air ridge type semiconductor laser device described above, the conventional semiconductor laser device described the above document has an electrode put in direct contact with the side surface of the ridge portion and the surface of the cladding layer that extends sidewise from the ridge portion. In this case, depending on the refractive index of the semiconductor material that constitutes the semiconductor laser device and the refractive index of the metal material that constitutes the electrode, the distribution of the oscillation laser light has sometimes became easy to leak toward the electrode formed on the side surface of the ridge portion and the surface of the cladding layer located in the neighborhood of the ridge portion.

Regarding the refractive index of the electrode material located on the ridge side employed in the conventional semiconductor laser device described in JP H04-111375 A, the material of Ti put in contact with the semiconductor layer has a refractive index of about 3.0 to 3.6 within a wavelength range of 650 nm to 1.5 µm, and the material of Pt provided on Ti has a refractive index of about 2.9 to 5.5 within the same wavelength range of 650 nm to 1.5 µm. On the other hand, the effective refractive index in a direction perpendicular to the substrate outwardly of the ridge portion is also, for example, about 3.2, and therefore, the refractive indexes of Ti and Pt become unignorable.

As described above, if the effective refractive index in the perpendicular direction outwardly of the ridge portion is close to the refractive index of the electrode material formed directly on the semiconductor layer, the oscillation laser light sometimes becomes easy to leak toward the electrode side.

The buried ridge type semiconductor laser device described above, in which the buried layer that is made of a semiconductor material and provided for current constriction exists on the p-type cladding layer excluding the ridge portion, and the semiconductor layer that becomes a contact layer is formed on the ridge portion and the p-type cladding layer, has had no such problems. Moreover, the air ridge type semiconductor laser device, in which the electrode is formed on the inorganic insulator provided for current constriction on the side surface of the ridge portion and the surface of the cladding layer that extends outwardly of the ridge portion, has not been required to take such a problem into consideration.

However, light sometimes leaks toward the electrode side formed on the ridge side in the conventional semiconductor laser device described in JP H04-111375 described above. If such a phenomenon occurs, since the metal material that constitutes the electrode generally has an optical absorption coefficient being about $10^4$ to $10^5$ times higher than that of the semiconductor material, the metal material that constitutes the electrode becomes a very large light-absorbing component, disadvantageously largely increasing the internal loss. It has consequently been discovered that the conventional semiconductor laser device has disadvantageously caused the problems of a reduction in the slope efficiency or an increase in the oscillation threshold current value.

SUMMARY OF THE INVENTION

An object of the present invention is to provide a semiconductor laser device capable of being manufactured at low cost, having a high oscillation efficiency by preventing the oscillation laser light from leaking toward the electrode put in contact with the ridge portion and the electrode located in the neighborhood of the ridge portion and operating with low power consumption (low threshold current) and a manufacturing method therefor.

A further object of the present invention is to provide an optical disk apparatus and an optical transmission system provided with the semiconductor laser device.

In order to achieve the above object, there is provided a semiconductor laser device comprising:

a first conductive type substrate;

an active layer provided on the first conductive type substrate;

a second conductive type semiconductor layer group, which is provided on the active layer and has a stripe-shaped ridge portion in an upper portion; and an electrode, which is put in contact with at least one of a side surface of the ridge portion of the second conductive type semiconductor layer group and a surface located in the neighborhood of the ridge portion of the second conductive type semiconductor layer group in a region excluding the ridge portion and an uppermost portion of the ridge portion, the electrode comprising a layer made of Ag on a side on which the electrode is put in contact with the second conductive type semiconductor layer group.

In this case, the "first conductive type" means one conductive type of the n-type and the p-type, and the "second conductive type" means the other conductive type of the n-type and the p-type.

The semiconductor laser device of the present invention is the so-called ridge waveguide type semiconductor laser device, which is allowed to have only one-time crystal growth process in the manufacturing stage as in the semiconductor laser device of the first prior art document. Therefore, the manufacturing processes are largely reduced and the device is manufactured at low cost in comparison with the semiconductor laser device of the general buried ridge structure.

According to the semiconductor laser device of the construction, the material of Ag used for the lowermost layer (on the side in contact with the semiconductor layer) of the electrode generally has a refractive index sufficiently, which is smaller than the refractive index of the semiconductor material used for the semiconductor layer group and is not greater than about 0.1 in the practical wavelength region of the semiconductor laser device. This is a particularly small value as compared with the values of other metal materials. Therefore, by using Ag for the lowermost layer of the electrode, the oscillation laser light can be confined in the semiconductor layer without being leaked toward the electrode put in contact with the ridge portion and the electrode located in the neighborhood of the ridge portion. As a result, the electrode material does not become an absorbing component of the oscillation laser light, and therefore, the internal loss is not increased.

As a result, it becomes possible to provide a semiconductor laser device that has a low oscillation threshold current and high slope efficiency at low cost.

On a surface opposite from the surface on which the layers are layered, another electrode that forms an ohmic junction with the surface should preferably be provided. With this arrangement, energization easily occurs between the two electrodes through the active layer, so that laser oscillation is achieved.

In one embodiment of the present invention, the electrode comprises a layer made of Ag, a layer made of a platinum group element or a platinum group element compound and a layer made of Au in order from the side on which the electrode is put in contact with the second conductive type semiconductor layer group.

In this case, the "platinum group element" is the generic term of ruthenium (Ru), rhodium (Rh), palladium (Pd), osmium (Os), iridium (Ir) and platinum (Pt), and the "platinum group element compound" means a compound that includes at least one of Ru, Rh, Pd, Os, Ir and Pt.

According to the semiconductor laser device of this embodiment, the platinum group element or the platinum group element compound formed on the layer made of Ag suppresses the reaction of Au provided in the uppermost layer of the electrode with Ag of the lowermost layer, thereby preventing the formation of an AgAu interface layer of a high resistance. As a result, an increase in the internal resistance of the electrode can be prevented.

Therefore, a semiconductor laser device, which is able to operate with low power consumption because of the low device resistance and a high slope efficiency and manufactured at low cost, can be provided.

In one embodiment of the present invention, the electrode is put in contact with both the side surface of the ridge portion of the second conductive type semiconductor layer group and the surface located in the neighborhood of the ridge portion of the second conductive type semiconductor layer group in the region excluding the ridge portion.

According to the semiconductor laser device of this embodiment, the electrode is put in contact with both the side surface of the ridge portion and the surface located in the neighborhood of the ridge portion. Therefore, the oscillation laser light can reliably be confined in the semiconductor layer, and an increase in the internal loss of the oscillation laser light can be further prevented.

In one embodiment of the present invention, the layer made of Ag of the electrode has a thickness of not smaller than 50 nm.

According to the semiconductor laser device of this embodiment, the thickness of the layer made of Ag of the electrode is not smaller than 50 nm. Therefore, the effect of using Ag of a refractive index extremely lower than that of the semiconductor material is exerted at maximum although the detail is described later. As a result, a semiconductor laser device, which is able to suppress the increase in the internal loss attributed to the electrode material provided on the ridge portion side to a minimum and operate with low power consumption concurrently satisfying a low oscillation threshold current and a high slope efficiency, can be provided.

Moreover, in the semiconductor laser device of this embodiment, the layer made of the platinum group element or the platinum group element constituting the electrode is a layer made of Pd.

According to the semiconductor laser device of this embodiment, the layer made of the platinum group element of the electrode is the layer made of Pd. This Pd layer suppresses diffusion of Au in the electrode uppermost layer to the Ag layer, preventing the formation of an AgAu interface layer. In addition, Ag and Pd react with each other at the interface to form an AgPd alloy layer and this layer gives sulfide resistance to Ag that is easily sulfurated. Furthermore, the AgPd alloy layer also has the effect of increasing the hardness of the soft surface of Ag by covering the surface, preventing the damage of the electrode in a wire bonding process or the like and improving the yield.

In one embodiment of the present invention, an AgPd alloy layer is provided at an interface between the layer made of the Ag and the layer made of the Pd of the electrode.

According to the semiconductor laser device of this embodiment, by providing the AgPd alloy layer on the surface of Ag of the electrode lowermost layer as described above, the sulfide resistance of Ag being easily sulfurated can be improved, and its hardness can be increased. This can prevent the most important layer made of Ag in the electrode from being degenerated and damaged and suppresses separation of the Au layer from the lower Pd layer. Accordingly, there are the effects of improving both the reliability and the manufacturing yield.

In one embodiment of the present invention, the layer made of Pd has a thickness of not smaller than 10 nm.

According to the semiconductor laser device of this embodiment, an AgPd alloy layer, which is able to sufficiently prevent Au of the electrode uppermost layer from diffusing to the layer of Ag of the lowermost layer and improving the sulfide resistance and the hardness by setting the thickness of the layer made of Pd to 10 nm or more, can reliably be formed.

In one embodiment of the present invention, a layer made of Pd is provided between the second conductive type semiconductor layer group and the layer made of Ag of the electrode.

According to the semiconductor laser device of this embodiment, the layer made of Pd is provided between the second conductive type semiconductor layer group and the layer made of Ag of the electrode. Therefore, the Pd layer suppresses the reaction between the second conductive type semiconductor layer group and the Ag layer, improving the reliability. Moreover, adhesion between the second conductive type semiconductor layer group and the Ag layer can be improved via the Pd layer.

In one embodiment of the present invention, an uppermost portion of the ridge portion of the second conductive type semiconductor layer group is comprised of a heavily doped semiconductor layer of a second conductive type impurity doping concentration of not smaller than $1\times10^{18}$ cm$^{-3}$, at least part of the second conductive type semiconductor layer group excluding the uppermost portion of the ridge portion is a lightly doped semiconductor layer of a second conductive type impurity doping concentration of not greater than $1\times10^{17}$ cm$^{-3}$, and the electrode is put in contact with the heavily doped semiconductor layer and the lightly doped semiconductor layer in succession.

According to the semiconductor laser device of this embodiment, a low contact resistance can be obtained at the ohmic junction between the heavily doped semiconductor layer, which is provided in the uppermost portion of the ridge structure and of which the impurity doping concentration is not smaller than $1\times10^{18}$ cm$^{-3}$, and the electrode.

On the other hand, a satisfactory current constriction property can be achieved at the Schottky junction between the lightly doped semiconductor layer, which is provided at least in the region other than the uppermost portion of the ridge structure and of which the impurity doping concentration is not greater than $1\times10^{17}$ cm$^{-3}$, and the electrode.

Since the satisfactory ohmic junction property and Schottky junction property can be concurrently satisfied as described above, a sufficient current constriction property and a low contact resistance can be achieved even if the crystal regrowth process of the buried layer (current blocking layer) for effecting the current constriction and the crystal regrowth process of the contact layer for obtaining the low contact resistance are not separately carried out, and thermal and electrical reliabilities are improved.

In one embodiment of the present invention, a second conductive type semiconductor layer having at least an impurity doping concentration of not smaller than $1\times10^{17}$ cm$^{-3}$ is formed between the lightly doped semiconductor layer and the active layer.

According to the semiconductor laser device of this embodiment, by further forming a second conductive type semiconductor layer that has at least an impurity doping concentration of not smaller than $1\times10^{17}$ cm$^{-3}$ between the lightly doped semiconductor layer and the active layer, the second conductive type semiconductor layer is freed from the limitations on the impurity doping concentration, composition, layer thickness and so on in consideration of the Schottky junction characteristic, and therefore, the layer thickness, composition and so on can freely be changed in accordance with the optical characteristic specifications required for the device. Furthermore, since the second conductive type semiconductor layer is doped heavier than the lightly doped semiconductor layer, an increase in the device resistance can be suppressed, and a further reduction in the power consumption can be achieved.

Also, there is provided a semiconductor laser device manufacturing method comprising the steps of:

forming an active layer on a first conductive type substrate;

forming a second conductive type semiconductor layer group having at least a lightly doped semiconductor layer of an impurity doping concentration of not greater than $1\times10^{17}$ cm$^{-3}$ and a heavily doped semiconductor layer of an impurity doping concentration of not smaller than $1\times10^{18}$ cm$^{-3}$ on the active layer;

forming a ridge portion by removing part of the second conductive type semiconductor layer group; and forming an electrode by depositing at least a layer made of Ag on the second conductive type semiconductor layer group.

According to the semiconductor laser device manufacturing method of the present invention, the material of Ag, of which the refractive index to the oscillation laser light is sufficiently smaller than that of the semiconductor material used for the semiconductor layer group, is formed as the electrode on the ridge portion side. Therefore, a method capable of manufacturing a semiconductor laser device, which is able to suppress the optical leakage toward the electrode put in contact with the ridge portion and the electrode located in the neighborhood of the ridge portion consequently eliminating the increase in the internal loss and to oscillate with a low threshold current at low cost, is provided.

In one embodiment of the present invention, an uppermost portion of the ridge portion is comprised of a layer made of GaAs, and a step for cleaning a surface of the uppermost portion of the ridge portion with hydrofluoric acid is provided before the step of forming the electrode.

According to the semiconductor laser device manufacturing method of this embodiment, by cleaning the uppermost portion of the ridge portion that is the GaAs layer with hydrofluoric acid, an extremely low contact resistance can be achieved between the Ag layer formed in the subsequent electrode forming process and the GaAs layer that is the uppermost layer of the ridge portion. As a result, a semiconductor laser device manufacturing method capable of further reducing the power consumption can be provided. Furthermore, the low contact resistance can be achieved without adding any annealing process or the like moreover does not change even if a heating process is carried out. Therefore, an electrode of extremely good reliability can be formed.

In one embodiment of the present invention, the hydrofluoric acid is a hydrofluoric acid solution diluted with water or ammonium fluoride by a dilution factor of not smaller than one tenth.

According to the semiconductor laser device manufacturing method of this embodiment, by using a hydrofluoric acid solution obtained by diluting hydrofluoric acid with water or ammonium fluoride by a dilution factor of not smaller than one tenth (not smaller than ten times) as the cleaning process with hydrofluoric acid, it becomes possible to prevent the compound semiconductor layer, which contains Al used for the cladding layer and the like of the semiconductor laser device, from being eroded by the etching effect in the cleaning process. As a result, a cleaning solution, which is easy to use without changing the shape of the ridge portion and the thickness of the cladding layer nor influencing the various characteristics of the semiconductor laser device, can be provided.

In one embodiment of the present invention, the step of forming the electrode comprises an electrode-forming step by depositing a layer made of a platinum group element or a platinum group element compound and a layer made of Au successively from the layer made of Ag.

According to the semiconductor laser device manufacturing method of the one embodiment, the electrode, in which the Au that has a low resistance and is not oxidized is layered, is formed via the platinum group element or the platinum group element compound on Ag put in contact with the semiconductor layer, and therefore, the electrode resistance on the ridge portion side of the semiconductor laser device can be kept low. In this case, since the process of inserting the platinum group element layer or platinum group element compound layer, which operates as a diffusion prevention layer between Ag and Au, is provided, an electrode of a lower resistance free from the formation of an AgAu alloy layer inside the electrode, can be formed.

In one embodiment of the present invention, the step of forming the electrode is to deposit the layer that becomes the electrode without exposing the layer to the atmosphere.

According to the semiconductor laser device manufacturing method of this embodiment, by forming the electrode on the ridge portion side by not exposing the Ag deposition process through the Au deposition process to the atmosphere, the electrode can be coated with the platinum group element or the platinum group element compound and Au without oxidizing Ag important for forming the ohmic junction and the Schottky junction on the second conductive type semiconductor layer group. There is a problem that, when the Ag surface is oxidized, adhesion to another metal layer that becomes its upper layer is significantly reduced and a silver oxide layer is formed at the interface with the metal layer, disadvantageously making the electrode have a high resistance. However, according to the manufacturing method of the embodiment, it becomes possible to prevent the separation of the layered metal layer and the increase in the resistance attributed to the factors.

In one embodiment of the present invention, the step of forming the electrode comprises a step for forming an AgPd alloy layer, by depositing a layer made of the Pd that serves as the layer made of the platinum group element or the platinum group element compound on a layer made of Ag, at an interface between the layer made of Ag and the layer made of Pd.

According to the semiconductor laser device manufacturing method of the one embodiment, by depositing the Pd layer succeeding the Ag layer of the lowermost layer of the electrode without exposing the layer to the atmosphere, the AgPd alloy layer can be formed at the interface without oxidizing nor sulfurating the surface of the Ag layer, and the formed AgPd alloy layer improves the sulfide resistance and increase the hardness of Ag that is easily sulfurated. Therefore, an electrode manufacturing method capable of preventing the degeneration and damage of the most important layer made of Ag of the electrode and suppressing also the separation of the Pd layer and the Au layer provided on the upper layer of the Ag layer is provided. Accordingly, a semiconductor laser device manufacturing method, which improves both the reliability and the manufacturing yield, can be provided.

In one embodiment of the present invention, the step of forming the second conductive type semiconductor layer group comprises a step for forming at least a second conductive type semiconductor layer that has an impurity doping concentration of not smaller than $1 \times 10^{17}$ cm$^{-3}$ between the lightly doped semiconductor layer and the active layer.

According to the semiconductor laser device manufacturing method of this embodiment, by further forming the second conductive type semiconductor layer that has at least an impurity doping concentration of not smaller than $1 \times 10^{17}$ cm$^{-3}$ between the lightly doped semiconductor layer and the active layer, a semiconductor laser device manufacturing method capable of freely changing the layer thickness, composition and so on in accordance with the optical characteristic specifications required for the device by virtue of the second conductive type semiconductor layer without being limited in consideration of the Schottky junction characteristic, suppressing the increase in the device resistance and further reducing the power consumption is provided.

In one embodiment of the present invention, an optical disk apparatus comprises the above semiconductor laser device According to the optical disk apparatus of the present invention, an optical disk apparatus, which can write with lower power consumption and is less expensively constructed than the conventional optical disk apparatus, can be provided.

In one embodiment of the present invention, an optical transmission system comprises the above semiconductor laser device.

According to the optical transmission system of the present invention, an optical transmission module that is less expensive and able to operate with lower power consumption than in the conventional case can be provided, allowing the optical transmission system to be reduced in cost and improved in performance.

According to the semiconductor laser device of the present invention, the oscillation laser light can be prevented from leaking toward the electrode put in contact with the ridge portion and the electrode located in the neighborhood of the ridge portion, and therefore, an increase in the absorption loss can be eliminated. Furthermore, it becomes possible to prevent the increase in the resistance of the layered electrode and the separation between the layered structures. Therefore, a semiconductor laser device capable of oscillating with a low threshold current, having low power consumption because of the high oscillation efficiency possessed, operating with a high output and manufactured at overwhelmingly low cost and with high yield, can be provided.

Moreover, according to the semiconductor laser device manufacturing method of the present invention, a method capable of manufacturing a semiconductor laser device that can operate with a high oscillation efficiency and low power consumption (low threshold current) simply at low cost is provided.

Moreover, according to the optical disk apparatus of the present invention, by employing the semiconductor laser device of the present invention, the apparatus is able to write data with lower power consumption and less expensively constructed than the conventional optical disk apparatus.

Moreover, according to the optical transmission system of the present invention, by employing the semiconductor laser device of the present invention for the optical transmission module, an optical transmission module that is less expensive and operable with lower power consumption than in the conventional case can be provided, allowing the optical transmission system to be reduced in cost and improved in performance.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE INVENTION

Figure 1:
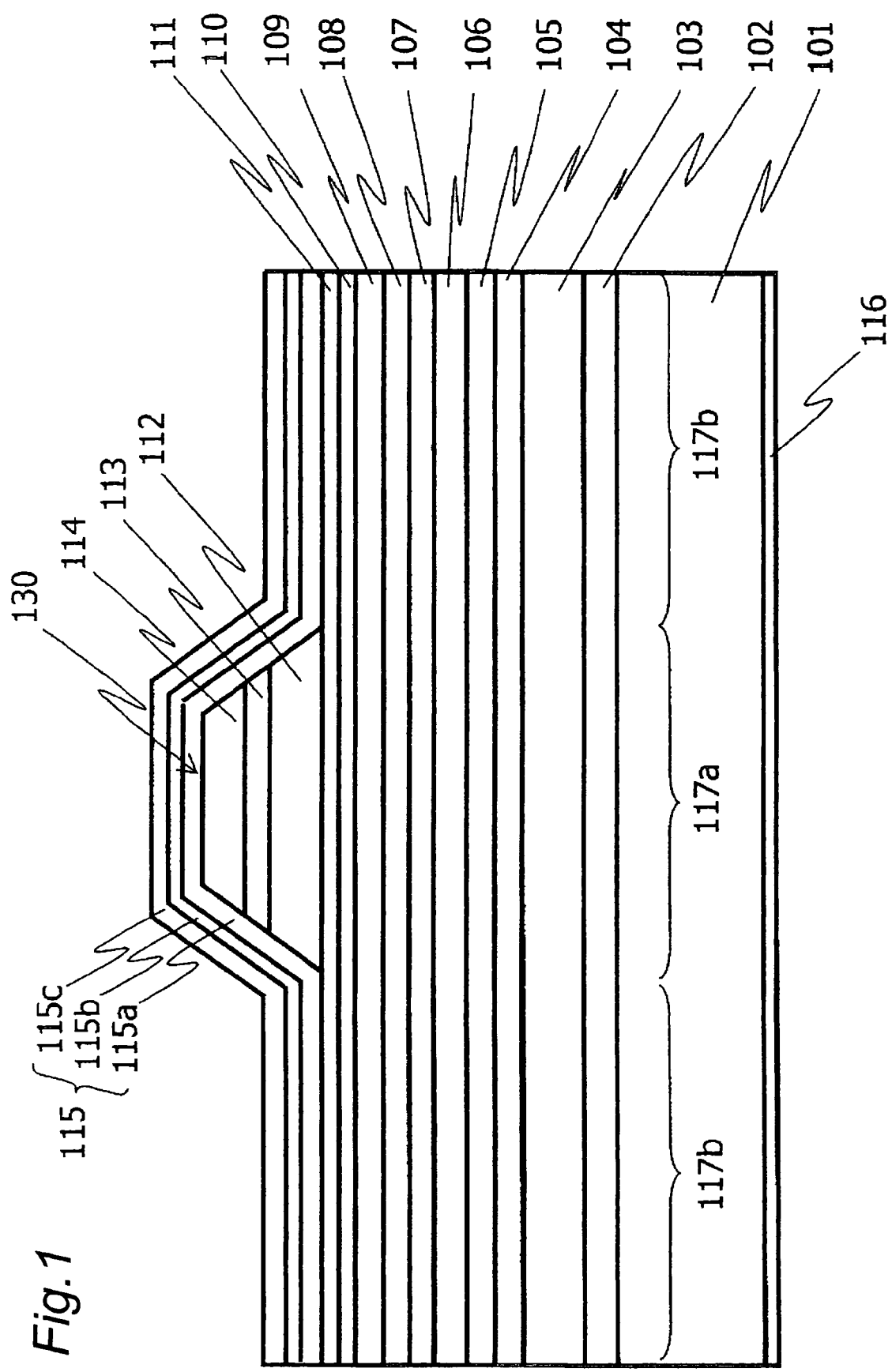
FIG. 1 is a schematic sectional view of a semiconductor laser device of a first embodiment of the present invention.

The semiconductor laser device, the manufacturing method thereof, the optical disk apparatus and the optical transmission system of the present invention will be described in detail below by the embodiments shown in the drawings.

It is noted that "n-" represents the n-type as the first conductive type, and "p-" represents the p-type as the second conductive type in the following description.

FIRST EMBODIMENT

FIG. 1 shows the structure of the semiconductor laser device of the first embodiment of the present invention. The semiconductor laser device has an n-GaAs buffer layer 102, an n-$Al_{0.5}Ga_{0.5}As$ first lower cladding layer 103, an n-$Al_{0.422}Ga_{0.578}As$ second lower cladding layer 104, an $Al_{0.25}Ga_{0.75}As$ lower guide layer 105, a multiple strained quantum well active layer 106, an $Al_{0.25}Ga_{0.75}As$ first upper guide layer 107, a p-$Al_{0.4}Ga_{0.6}As$ second upper guide layer 108, a p-$Al_{0.456}Ga_{0.544}As$ first upper cladding layer 109, a p-$Al_{0.456}Ga_{0.544}As$ second upper cladding layer 110 as one example of the lightly doped semiconductor layer and a p-$In_{0.1568}Ga_{0.8432}As_{0.4}P_{0.6}$ semiconductor layer 111 are successively layered on an n-GaAs substrate 101.

A p-$Al_{0.5}Ga_{0.5}As$ third upper cladding layer 112, a p-GaAs contact layer 113 and a p$^+$-GaAs contact layer 114 are provided forming a forward mesa stripe shaped ridge portion 130 on the semiconductor layer 111.

A p-side electrode 115 constructed of a multilayer metal thin film formed by layering an Ag layer 115a, a Pd layer 115b and an Au layer 115c in this order is provided at the top portion and the side surface portion of the ridge portion 130 and on the semiconductor layer 111.

Moreover, an n-side electrode 116 constructed of an AuGe/Ni/Au multilayer metal thin film is formed as another electrode layer on the back surface of the substrate 101.

The p-$Al_{0.4}Ga_{0.6}As$ second upper guide layer 108, the p-$Al_{0.456}Ga_{0.544}As$ first upper cladding layer 109, the p-$Al_{0.456}Ga_{0.544}As$ second upper cladding layer 110, the p-$In_{0.1568}Ga_{0.8432}As_{0.4}P_{0.6}$ semiconductor layer 111, the p-$Al_{0.5}Ga_{0.5}As$ third upper cladding layer 112, the p-GaAs contact layer 113 and the p$^+$-GaAs contact layer 114 constitute a second conductive type semiconductor layer group.

A method for manufacturing the semiconductor laser device is described next with reference to FIG. 2 through FIG. 4. FIG. 5 shows an enlarged schematic view of the periphery of the ridge structure of the semiconductor laser device.

Figure 2:
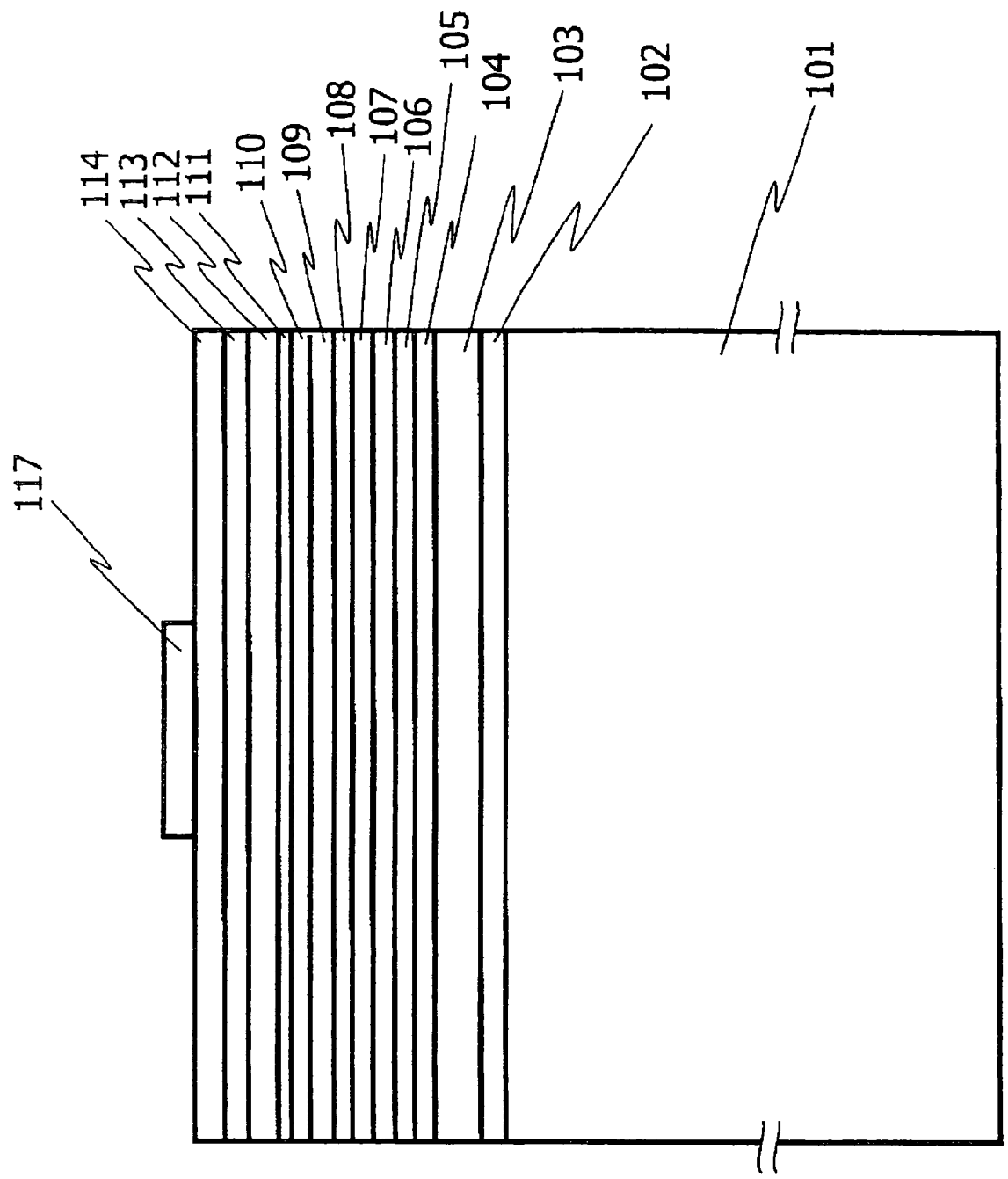
FIG. 2 is a schematic view for explaining a manufacturing process of the semiconductor laser device of the first embodiment of the present invention, showing a state in which a photomask for ridge formation is provided after crystal growth.

First, as shown in FIG. 2, the n-GaAs buffer layer 102 (layer thickness: 0.5 μm, Si doping concentration: $7.2 \times 10^{17}$ cm$^{-3}$), the n-$Al_{0.5}Ga_{0.5}As$ first lower cladding layer 103 (layer thickness: 2.0 μm, Si doping concentration: $5.4 \times 10^{17}$ cm$^{-3}$), the n-$Al_{0.422}Ga_{0.578}As$ second lower cladding layer 104 (layer thickness: 0.1 μm, Si doping concentration: $5.4 \times 10^{17}$ cm$^{-3}$), the $Al_{0.25}Ga_{0.75}As$ lower guide layer 105 (layer thickness: 3.0 nm), the multiple strained quantum well active layer 106, the $Al_{0.25}Ga_{0.75}As$ first upper guide layer 107 (layer thickness: 3.0 nm), the p-$Al_{0.4}Ga_{0.6}As$ second upper guide layer 108 (layer thickness: 0.1 μm, Zn doping concentration: $1.35 \times 10^{18}$ cm$^{-3}$), the p-$Al_{0.456}Ga_{0.544}As$ first upper cladding layer 109 (layer thickness: 0.2 μm, Zn doping concentration: $1.35 \times 10^{18}$ cm$^{-3}$), the p-$Al_{0.456}Ga_{0.544}As$ second upper cladding layer 110 (layer thickness: 0.2 μm, Zn doping concentration: $1 \times 10^{17}$ cm$^{-3}$), the p-$In_{0.1568}Ga_{0.8432}As_{0.4}P_{0.6}$ semiconductor layer 111 (layer thickness: 15 nm, Zn doping concentration: $1 \times 10^{17}$ cm$^{-3}$), the p-$Al_{0.5}Ga_{0.5}As$ third upper cladding layer 112 (layer thickness: 1.28 μm, Zn doping concentration: $2.4 \times 10^{18}$ cm$^{-3}$), the p-GaAs contact layer 113 (layer thickness: 0.2 μm, Zn doping concentration: $3 \times 10^{18}$ cm$^{-3}$) and the p$^+$-GaAs contact layer 114 (layer thickness: 0.3 μm, Zn doping concentration: $1 \times 10^{19}$ cm$^{-3}$) are successively crystallinically grown on the (100) plane of the n-GaAs substrate 101 by the MOCVD method (metal-organic chemical vapor deposition method).

The multiple strained quantum well active layer 106 is formed by alternately arranging an $In_{0.1}Ga_{0.9}As$ compressive strained quantum well layer (strain: 0.7%, layer thickness: 4.6 nm, two layers) and an $In_{0.24}Ga_{0.76}As_{0.55}P_{0.45}$ tensile strain barrier layer (strain: 0.1%, bandgap Eg≈1.60 eV, three layers of layer thicknesses: 21.5 nm, 7.9 nm and 21.5 nm, respectively, from the substrate side, the layer located nearest to the substrate 101 serves as an n-side barrier layer, and the farthest layer serves as a p-side barrier layer).

Next, a resist mask 117 (mask width: 3.5 μm) is produced by a photolithography process in a region 117a (See FIG. 1) where the ridge portion 130 is to be formed as shown in FIG. 2. The resist mask 117 is formed extending in the <0-11> direction in a stripe form in correspondence with the direction in which the ridge portion 130 to be formed extends.

Figure 3:
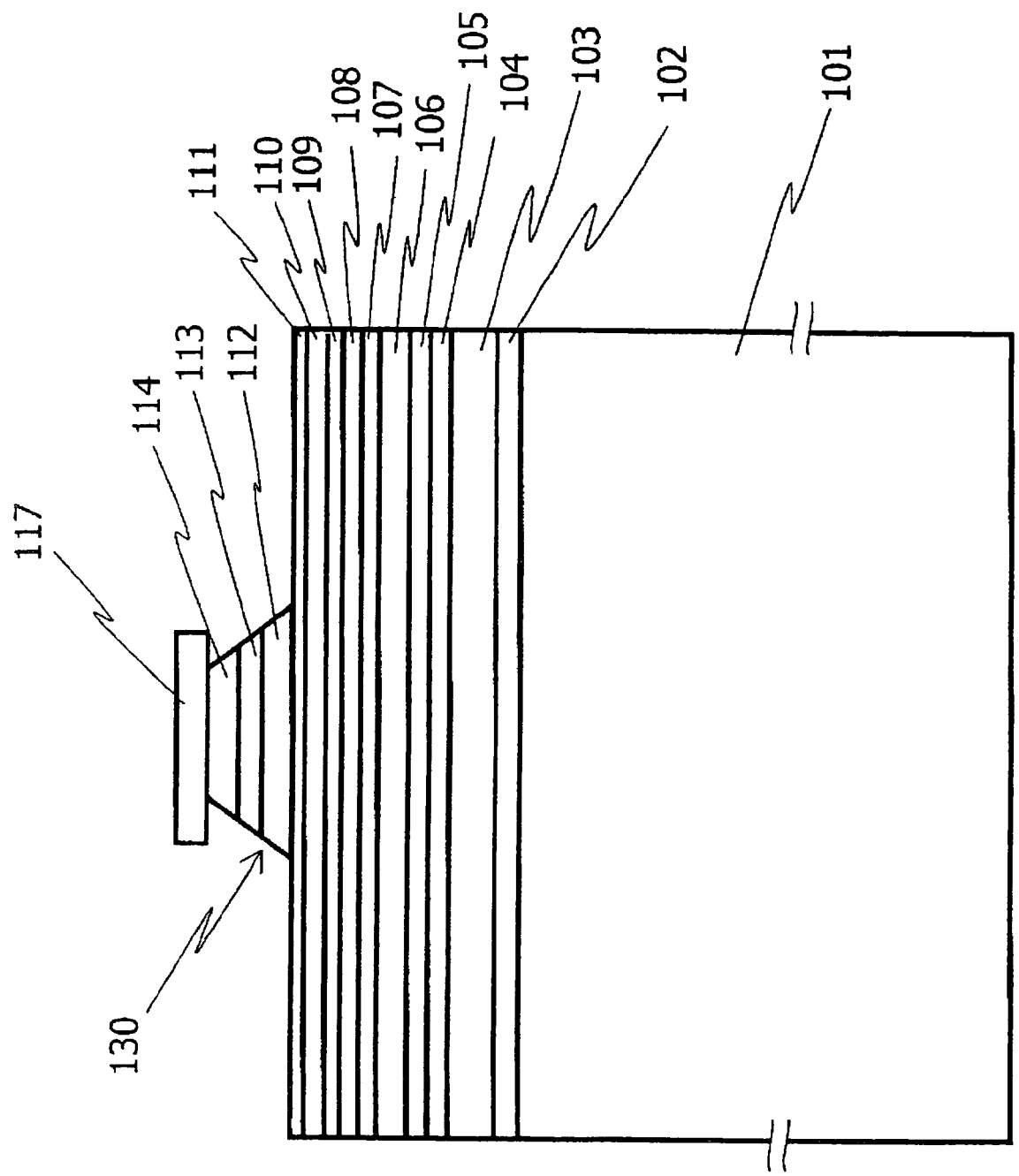
FIG. 3 is a schematic view for explaining a manufacturing process of the semiconductor laser device of the first embodiment of the present invention, showing a state after an etching process for ridge formation.

Next, as shown in FIG. 3, the forward mesa stripe shaped ridge portion 130 is formed just under the resist mask 117 by removing by etching a ridge formation outside region 117b, which corresponds to both sides of the resist mask 117, of the p-AlGaAs third upper cladding layer 112, the p-GaAs contact layer 113 and the $p^+$-GaAs contact layer 114 using the resist mask 117 as a mask. The etching is effected to a portion just on the semiconductor layer 111 by using an aqueous solution of a mixture of sulfuric acid and a hydrogen peroxide aqueous solution. Subsequently, overhanging portions of the GaAs contact layers 113 and 114 are removed by an aqueous solution of a mixture of ammonia and a hydrogen peroxide aqueous solution. The depth of etching is 1.78 μm, and the width of the lowermost portion of the ridge portion 130 is about 3.2 μm. The resist mask 117 is removed after the etching ends.

Next, the exposed surface of the semiconductor layer 111, the side surface of the ridge portion 130 and the surface of the uppermost portion of the ridge portion 130 were cleaned for 30 seconds with buffered hydrofluoric acid (hydrofluoric acid:ammonium fluoride=1:10).

Figure 4:
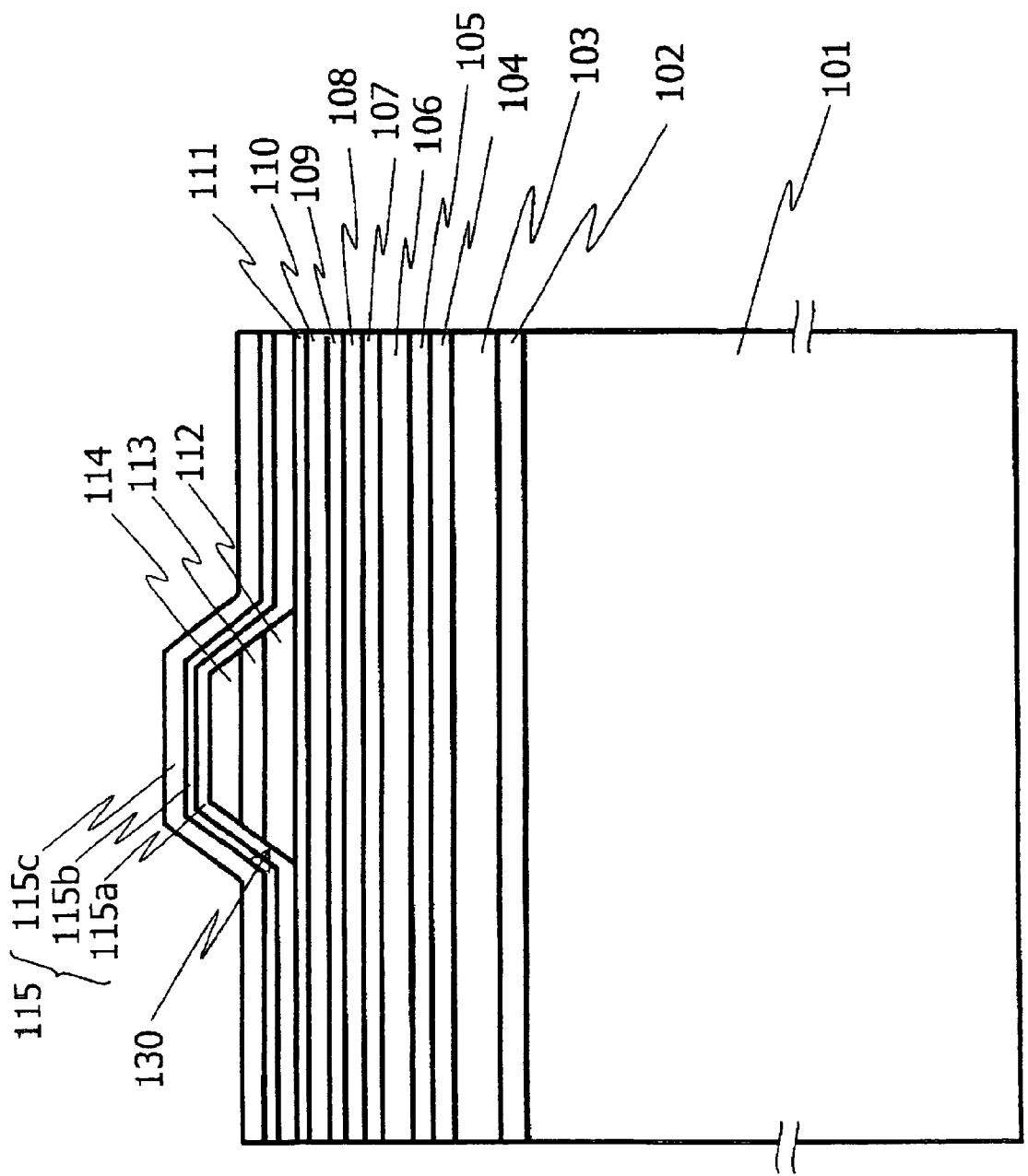
FIG. 4 is a schematic view for explaining a manufacturing process of the semiconductor laser device of the first embodiment of the present invention, showing a state after a deposition process of a p-side electrode.
Figure 5:
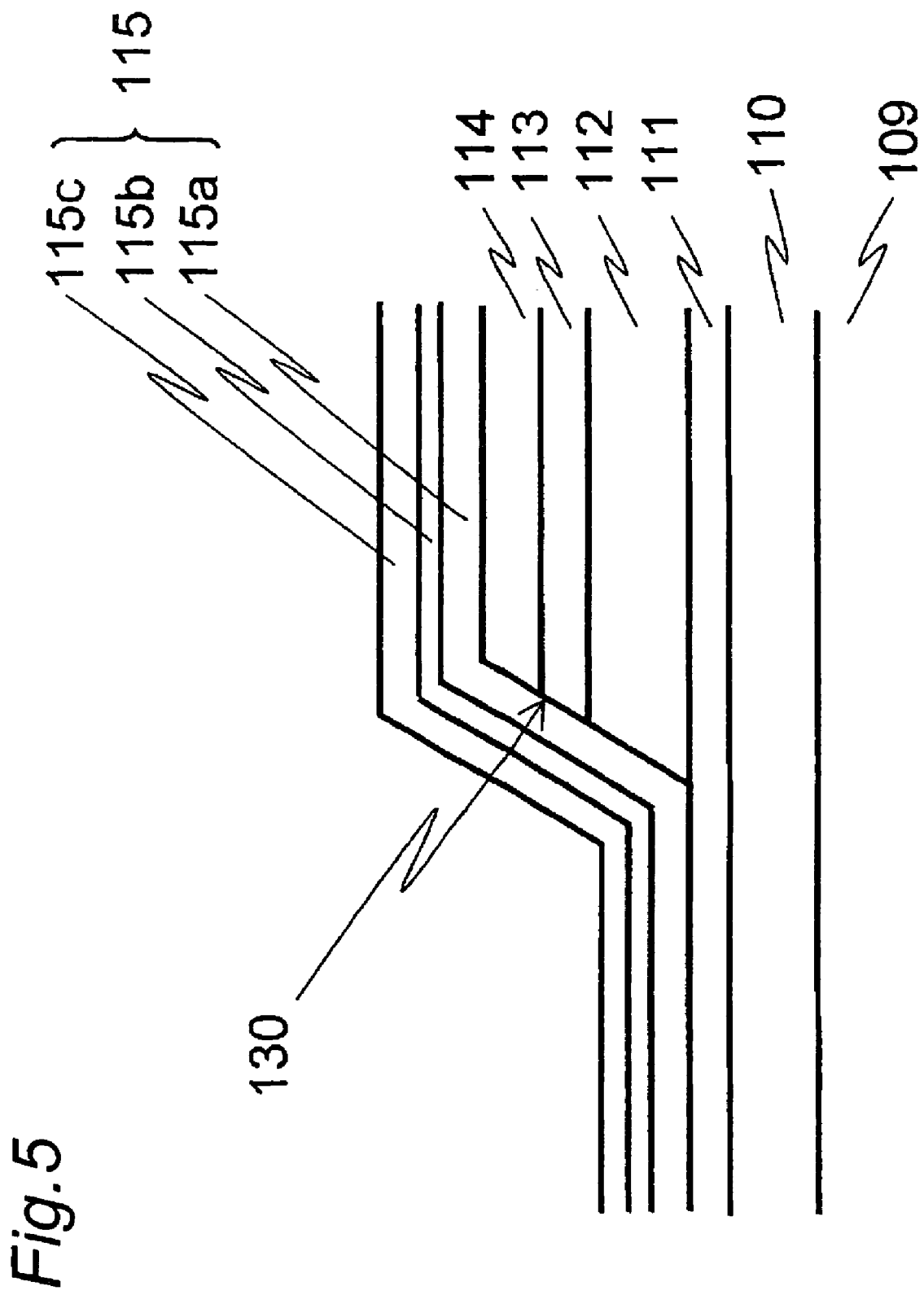
FIG. 5 is an enlarged schematic view of the periphery of the ridge structure of the semiconductor laser device of the first embodiment of the present invention.

Subsequently, as shown in FIG. 4, a metal thin film is formed as the p-side electrode 115 by layering the Ag layer 115a (layer thickness: 50 nm), the Pd layer 115b (layer thickness: 30 nm) and the Au layer 115c (layer thickness: 300 nm) in this order by the electron beam evaporation method.

Subsequently, as shown in FIG. 1, the substrate 101 is abraded by the lapping method from the back surface side to the desired thickness (about 100 μm in this case). Then, an AuGe alloy (alloy of 88% Au and 12% Ge, layer thickness: 100 nm), Ni (layer thickness: 15 nm) and Au (layer thickness: 300 nm) are layered formed as the n-side electrode 116 by the resistance heating deposition method from the back surface.

Subsequently, the n-side electrode 116 is subjected to an alloying process in an $N_2$ atmosphere by heating at a temperature of 390° C. for one minute.

The substrate 101 is divided into a plurality of bars that have the desired resonator length (800 μm in this case), and thereafter, end surfaces of the bars are coated. Further, the bars are divided into chips (800 μm×250 μm). The chips after the division are fixed to a stem (not shown) with an In paste. Then, an Au wire (not shown) for electrical connection to the external circuit is bonded onto the p-side electrode 115. The semiconductor laser device is thus completed.

When a current is flowed between the p-side electrode 115 and the n-side electrode 116 of the thus manufactured semiconductor laser device, the current is interrupted at the Schottky junction between the lightly doped semiconductor layer located beside the ridge portion 130 and the p-side electrode 115, and the current is flowed only through the ohmic junction between the $p^+$-GaAs contact layer 114 that is the heavily doped semiconductor layer provided in the uppermost portion of the ridge portion 130 and the p-side electrode 115. As a result, current constriction is effected.

As described above, the semiconductor laser device of the first embodiment, which was allowed to have only one-time crystal growth process in the manufacturing stage, was able to be manufactured at lower cost by virtue of the remarkably reduced number of manufacturing processes than in the general semiconductor laser device of the buried ridge structure.

In the semiconductor laser device of the embodiment, the p-side electrode was able to provide a satisfactory ohmic junction that had a low contact resistance with respect to the $p^+$-GaAs contact layer doped to $1\times10^{19}$ $cm^{-3}$ in the top portion of the ridge. In the case of the ohmic junction that uses Ag as described above, a practically sufficient contact resistance can be obtained by making $p^+$-GaAs have a doping concentration of not smaller than $1\times10^{18}$ $cm^{-3}$. Moreover, by further increasing the doping concentration, an ohmic junction of a lower contact resistance can be provided.

In this case, an extremely low contact resistance on the order of $10^{-7}$ $\Omega cm^2$ was able to be achieved from the state immediately after deposition (as deposited) by depositing a layer made of Ag after the surface of the $p^+$-GaAs layer had been cleaned with the hydrofluoric acid solution as described above. Furthermore, the contact resistance, which does not change even through the alloying process carried out for the n-side electrode described above or thermal processing for a longer time, is very excellent in terms of reliability. It is noted that the hydrofluoric acid solution used for cleaning the surface of the $p^+$-GaAs layer may be a hydrofluoric acid aqueous solution diluted with water besides the buffered hydrofluoric acid described above. The dilution with ammonium fluoride or water should preferably have a dilution factor of not smaller than one tenth, with which the p-AlGaAs third upper cladding layer formed on the lower side of the contact layer is not disadvantageously dissolved by the etching. It is noted that the dilution factor should preferably be not greater than 100 times since the effect of cleaning with hydrofluoric acid is not sufficiently produced in the case of a dilution factor that exceeds 100 times.

The cleaning process with hydrofluoric acid is effective particularly when the contact layer that forms an ohmic junction with the electrode made of Ag is made of a material of GaAs. Moreover, when the cleaning process is not carried out, an appropriate annealing process is sometimes required to achieve a sufficiently low contact resistance.

On the other hand, a Schottky junction, which exhibits a sufficient current constriction property to the $p-Al_{0.456}Ga_{0.544}As$ second upper cladding layer that is the lightly doped semiconductor layer doped to $1\times10^{17}$ $cm^{-3}$ located beside the ridge portion and the $p-In_{0.1568}Ga_{0.8432}As_{0.4}P_{0.6}$ semiconductor layer and also stable to long-term thermal and electrical stresses, was able to be obtained.

Further, according to the semiconductor laser device of the first embodiment, a semiconductor laser device, which was characterized by having the p-side electrode of the electrode construction in which the Ag layer served as the lowermost layer and the Au layer served as the uppermost layer via Pd of one of the platinum group elements and able to achieve a high oscillation efficiency by virtue of the construction and oscillate with a low threshold current, was able to be manufactured.

In general, the Ag is easily sulfurated and oxidized and easily damaged by the wire bonding process and the like since it is soft. Further, the problems of an increase in the resistance value, the separation of the metal layer formed on the Ag layer and so on, are disadvantageously caused by sulfuration and oxidation. However, the first embodiment of the present invention had the effect of improving both the sulfide resistance and the mechanical strength and was able to improve the characteristics (resistance value, reliability, mechanical strength, etc.) of the p-side electrode by covering the surface of the Ag layer that is easily sulfurated and oxidized by virtue of the two-layer structure of the Pd layer that had the effect of preventing the diffusion of the Au layer and the Au layer that is hard to oxidize.

As a result, by employing the construction of the p-side electrode of the first embodiment as described above, a semiconductor laser device that had satisfactory electrical properties including reliability was able to be provided. It is noted that the p-side electrode may be constructed of at least an Ag layer.

In addition, by using Ag for the lowermost layer of the p-side electrode provided on the ridge side in the semiconductor laser device of the first embodiment, a semiconductor laser device that also had satisfactory optical characteristics was able to be successfully provided. This point is described in detail below.

In general, the ridge waveguide type semiconductor laser devices often employ an electrode construction in which Ti/Pt/Au that requires no alloying and are allowed to dispense with a consideration for the diffusion of the electrode material deep into the semiconductor layer are successively laminated as the electrode material formed on the ridge portion side.

The above is for the reasons as follows. When an AuZn alloy frequently used in the buried ridge type semiconductor laser device is used, a satisfactory ohmic junction can be obtained by carrying out the alloying process. However, the diffusion of metal atoms those constitute the electrode progresses rapidity in a spike form, and this causes a concern about increases in internal scattering and absorption loss attributed to the diffused metal atoms in addition to the degradation of reliability attributed to the deterioration of the crystallinity in accordance with the progress of diffusion. The phenomenon highly possibly occurs in the ridge waveguide type semiconductor laser device in which the electrode position is located near the active layer, and the influence should be avoided.

However, it has been discovered that another problem occurs when the Ti/Pt/Au electrode that requires no alloying is applied to a semiconductor laser device that effects current constriction using the Schottky junction as shown in the first embodiment. That is, since the refractive index values of Ti and Pt are extremely close to the refractive index value of the semiconductor layer that constitutes the semiconductor laser device, the effect of confining the oscillation laser light in the semiconductor layer is disadvantageously reduced.

For example, the material of Ti has a refractive index of about 3.0 to 3.6 within a wavelength range of 650 nm to 1.5 µm, and the material of Pt has a refractive index of 2.9 to 5.5 within a wavelength range of 668 nm to 1.5 µm. On the other hand, the effective refractive index of the semiconductor layer structure in the direction perpendicular to the substrate outwardly of the ridge portion is also, for example, about 3 to 3.5. In particular, the refractive index of the electrode material formed in the neighborhood of the ridge side exerts a large influence on the optical distribution of the oscillation laser light. If the refractive index is close to the effective refractive index of the semiconductor layer structure, an optical distribution configuration such that light leaks to the electrode tends to result.

In general, the absorption coefficient of the metal used as an electrode material is $10^4$ to $10^5$ times greater than the absorption coefficient of the semiconductor, and therefore, a very large absorption loss is disadvantageously generated if light leaks to the electrode as described above. It has been discovered that the slope efficiency of the semiconductor laser device is largely reduced by the absorption loss.

In contrast to the above, the material of Ag used for the lowermost layer of the p-side electrode in the first embodiment has a refractive index of not greater than about 0.1 within a wavelength range of 400 nm to 1 µm. Table 1 below shows the refractive index values of the Ag film formed by deposition excerpted from the pages 149 through 150 of Chapter 6 of AMERICAN INSTITUTE OF PHYSICS HANDBOOK THIRD EDITION.

TABLE 1

Refractive Index of Deposited Ag Film

| Wavelength (µm) | Refractive index |
|---|---|
| 0.400 | 0.075 |
| 0.450 | 0.055 |
| 0.500 | 0.050 |
| 0.550 | 0.055 |
| 0.600 | 0.060 |
| 0.650 | 0.070 |
| 0.700 | 0.075 |
| 0.750 | 0.080 |
| 0.800 | 0.090 |
| 0.850 | 0.100 |
| 0.900 | 0.105 |
| 0.950 | 0.110 |
| 1.000 | 0.24 |
| 1.500 | 0.45 |

Since the refractive index of the semiconductor material that constitutes the semiconductor laser device is about 3 to 3.5, the Ag material has a sufficiently large refractive index difference ($\Delta n \geq 2$ to 3) with respect to light that oscillates at a wavelength of 400 nm to 1.5 µm, which is or has been put into practical use as a semiconductor laser as apparent from Table 1. The refractive index difference has a value remarkably larger than that of other metal materials. For the above reasons, if the Ag material is used as the electrode to be formed on the side of the ridge portion, it becomes possible to largely increase the effect of confining the oscillation laser light in the semiconductor layer. Therefore, a semiconductor laser device, which was able to suppress the leakage of light to the electrode and consequently posses a high slope efficiency free from absorption loss, was able to be provided.

Figure 6:
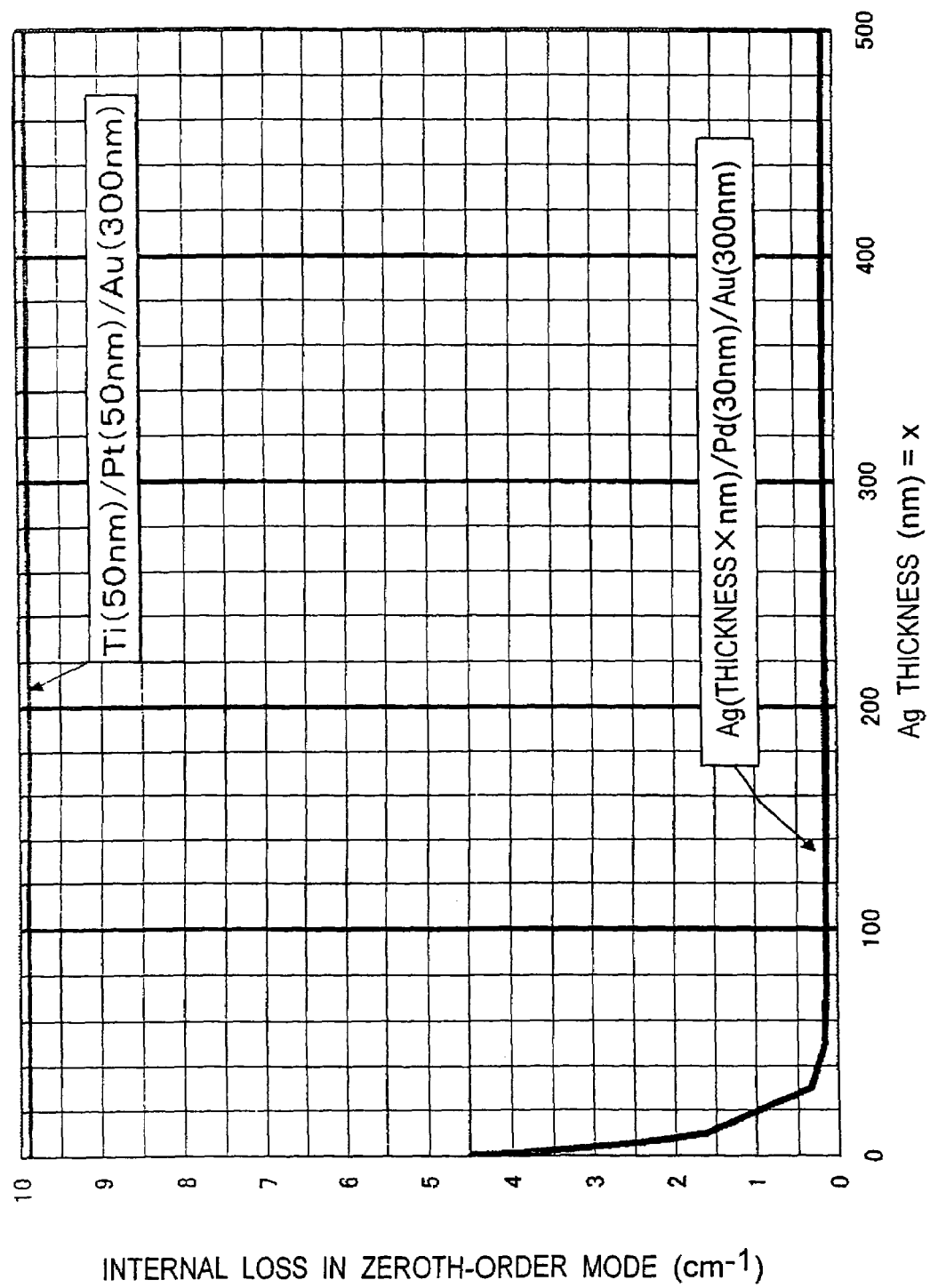
FIG. 6 is a graph showing the relation between the thickness and the internal loss of Ag of the p-side electrode.

FIG. 6 shows the relation between the thickness of the Ag layer of the p-side electrode and the internal loss in the zeroth-order mode. The graph supposes light of a wavelength of 800 nm (refractive index: 0.090) and the amount of internal loss when the thickness of the Ag layer in the p-side electrode construction of the present embodiment is changed is simulated by calculation. FIG. 6 also clearly shows the amount of internal loss when the conventional Ti (50 nm)/Pt (50 nm)/Au (300 nm) electrode is used. As is apparent from FIG. 6, when the thickness of the Ag layer is increased from zero, the internal loss starts to reduce. Further, the internal loss reduces as the Ag layer thickness increases until the thickness of the Ag layer becomes about 30 nm, and the internal loss can be reduced to one tenth or less than when Ag is not inserted when the thickness of Ag is set to 30 nm. If the thickness of the Ag layer is further increased, the internal loss is further reduced. However, the degree of reduction becomes gentle, and the effect of reducing the internal loss can be maximized by setting the layer thickness to a thickness of not smaller than 50 nm.

On the basis of the results, a semiconductor laser device was manufactured by setting the thickness of the Ag layer to 50 nm in the first embodiment. When a semiconductor laser device having the conventional electrode construction was additionally manufactured for the sake of comparison, the internal loss calculated from an actual device of a difficult resonator length of the semiconductor laser device of the present embodiment was 2 cm$^{-1}$, which was largely reduced in comparison with the actual measurement value of 18 cm$^{-1}$ when the conventional Ti/Pt/Au electrode was employed. As a result, the semiconductor laser device of the first embodiment achieved a slope efficiency exceeding 1.0 W/A in spite of the ridge waveguide type that used the Schottky junction for current constriction.

As already described, the semiconductor laser device of the first embodiment has the remarkable feature of the electrode construction in which not only Ag is applied to the lowermost layer of the electrode formed on the ridge portion side but also the Au layer of the uppermost layer is formed via the Pd layer that is one of the platinum group elements.

In general, the material of Au used for the electrode surface is often used since it has the advantage that an intermetallic junction can easily be formed by pressure welding because of inoxidizability in addition to the low resistance thereof. However, if the Au layer is directly formed when Ag is provided in the lower layer as in the present invention, an AgAu alloy layer is easily formed at the interface between Ag and Au. The AgAu alloy layer becomes an interfacial layer of a high resistance and sometimes largely increase the series resistance of the semiconductor laser device.

Therefore, the electrode of the first embodiment had a construction in which the platinum group element or the platinum group element compound having the effect of preventing the diffusion of Au was formed on the Ag layer. Further, the material of Pd among the platinum group elements was able to improve the sulfide resistance reacting with Ag at the interface and increase the mechanical strength, and the present embodiment had a construction in which the material of Pd is formed on the Ag layer. As a result, a semiconductor laser device, which was able to prevent the increase in the resistance value and electrode damage in the subsequent processes of the wire bonding process and so on and operate with low power consumption, was able to be manufactured with satisfactory yield.

In the first embodiment, the thickness of the Pd layer was set to 30 nm. It is discovered that the Pd layer has a satisfactory effect of preventing the diffusion of Au when formed at least to a thickness of not smaller than 10 nm according to evaluations of the resistance of the electrode portion. Moreover, it is discovered that the mechanical strength is increased by forming the Pd layer at least to a thickness of not smaller than 10 nm on the Ag layer according to a wire-bonding test.

In the present embodiment, it was determined that the Pd layer was formed to a thickness of 30 nm also taking the variation in the film thickness of the layer to be formed into consideration. By thus forming the two layers of the Pd layer that improves the characteristics of the Ag layer and the Au layer that is very hard to oxidize on the Ag layer, the resistance value of the p-side electrode was able to be reduced, and the strength to the wire bonding was able to be improved.

In the p-side electrode forming process, the vacuum evaporation method such as the electron beam evaporation method, the sputtering method and the like can be applied like the manufacturing method of the present first embodiment. In this case, by consistently carrying out the deposition of the Ag layer of the lowermost layer to the deposition of the Au layer of the uppermost layer without exposure to the atmosphere on the way, the possibility of sulfurating and oxidizing the Ag layer formed as the electrode lowermost layer is eliminated, allowing the electrode resistance to be reduced.

Although the construction in which the Pd layer is interposed between the Ag layer and the Au layer has described in connection with the present embodiment, the present invention is, of course, not limited to the construction. By interposing a layer constructed of a platinum group element of Pt or the like or a platinum group element compound, a satisfactory electrode construction in which the formation of an AgAu alloy layer of a high resistance is prevented can be provided as in the case where the Pd layer is employed.

Furthermore, it is effective for preventing the formation of the AgAu alloy layer of a high resistance to provide a structure in which a layer made of Ti, Cr, Mo or the like is interposed between the Ag layer and the Au layer besides the platinum group element or the platinum group element compound.

Moreover, the semiconductor laser device of the present first embodiment was able to obtain sufficient current constriction by making the p-Al$_{0.456}$Ga$_{0.544}$As second upper cladding layer 110 and the p-In$_{0.1568}$Ga$_{0.8432}$As$_{0.4}$P$_{0.6}$ semiconductor layer 111 have a Zn doping concentration of $1\times10^{17}$ cm$^{-3}$ as described above. The total thickness of these layers is 0.215 µm. The total thickness of the semiconductor layer of a doping concentration of not greater than $1\times10^{17}$ cm$^{-3}$ is required to be not smaller than 0.2 µm in order to achieve sufficient current constriction.

Although the semiconductor layer of a doping concentration of not greater than $1\times10^{17}$ cm$^{-3}$ has had the two-layer structure in the present embodiment, it is, of course, acceptable to provide one layer or three or more layers. However, the uppermost layer should preferably be made of InGaAsP as in the present embodiment. The InGaAsP semiconductor layer, which is hard to oxidize since it does not contain Al, produces a great effect on maintaining current constriction (reliability) for a long term. Furthermore, since the etching characteristics are varied with respect to the semiconductor materials of GaAs, AlGaAs and so on, there is an advantage that highly accurate ridge formation by selective etching becomes possible.

Although InGaP can be used in the point that Al is not contained, there is an effect that InGaAsP has a lower barrier to holes than that of InGaP and the hole injection efficiency can be further improved in the case of application particularly to the p-type semiconductor layer as in the present embodiment.

In the semiconductor laser device of the first embodiment, the p-Al$_{0.456}$Ga$_{0.544}$As first upper cladding layer 109 (layer thickness: 0.2 µm, Zn doping concentration: $1.35\times10^{18}$ cm$^{-3}$), of which the impurity doping concentration is increased although the composition is the same as that of the second upper cladding layer, is provided between the second upper cladding layer and the active layer. By changing the thickness of the layer, adjustment is performed so that the desired optical characteristics are obtained. It is, of course, acceptable to change not only the thickness but also the composition.

By adopting the construction in which the semiconductor layer of which the impurity doping concentration was increased was formed on the active layer side with respect to the semiconductor layer of a doping concentration of not greater than $1\times10^{17}$ cm$^{-3}$ provided for satisfactory current constriction as in the present embodiment, a device resistance greater than necessary was able to be suppressed, and a deterioration in the device characteristics was able to be prevented.

Although the example, in which the electrode construction of the present invention is applied to the ohmic junction and the Schottky junction of the p-type semiconductor layer, has been described in the foregoing description, it is a matter of course that a similar effect can be obtained even when the construction is used for an n-type semiconductor layer.

As described hereinabove, the semiconductor laser device of the present embodiment is characterized in that the electrode, in which the material of Ag that has a great refractive index difference of two to three with respect to the semiconductor layer is used as the lowermost layer, and the Pd layer that has the effect of preventing the material of Au that has a low resistance and is hardly oxidized, easily pressure welded and used as the uppermost layer from reacting with the material of Ag of the lowermost layer and consequently preventing Au from forming a high-resistance interfacial layer, preventing the material of Ag from being sulfurated and improving the mechanical strength is interposed.

The electrode structure is able to obtain an ohmic junction that has a low contact resistance with respect to the contact layer doped to $1 \times 10^{18}$ cm$^{-3}$ or more, and achieve sufficient current constriction with respect to the semiconductor layer doped to $1 \times 10^{17}$ cm$^{-3}$ or less. Furthermore, according to the electrode construction, the effect of confining the oscillation laser light in the semiconductor layer is large, and there is no increase in the internal loss attributed to the leak of light to the electrode.

In the electrode structure described above, a satisfactory ohmic junction is sometimes obtained with respect to a particularly p-type doped contact layer. This is presumably ascribed to the fact that the work function of Ag is greater than that of other metal materials.

For the above reasons, it became possible to provide a semiconductor laser device, which had a sufficient current constriction property and a low contact resistance even without separately carrying out the crystal regrowth process of the buried layer (current blocking layer) for effecting current constriction and the crystal regrowth process of the contact layer for obtaining a low contact resistance, and a manufacturing method therefor.

Furthermore, with the structure and the manufacturing method as described above, the semiconductor laser device of the present first embodiment became able to prevent the oscillation laser light from leaking to the electrode put in contact with the ridge portion and the electrode located in the neighborhood of the ridge portion and therefore eliminate the increases in the internal scattering and the absorption loss. Therefore, a semiconductor laser device, which has high slope efficiency and low power consumption and a high power operation because of the capability of oscillation with a low threshold current, has become able to be manufactured at extremely lower cost than in the conventional case.

Although the SCH structure (Separate Confinement Heterostructure) that has the guide layer between the active layer and the cladding layer has been used in the present embodiment, the present invention is, of course, not limited to the structure described above. For example, it is a matter of course that the layer thicknesses and the materials of the layers can be changed within a range being not departing from the spirit and scope of the present invention by adding an intermediate layer for smoothly carrying out crystal growth or taking other measures.

Moreover, the electrode may be put in contact with both the side surface of the ridge portion of the second conductive type semiconductor layer group and the surface of the second conductive type semiconductor layer group located in the neighborhood of the ridge portion excluding the ridge portion. As described above, since the electrode is put in contact with both the side surface of the ridge portion and the surface located in the neighborhood of the ridge portion, the oscillation laser light can reliably be confined in the semiconductor layer, and the increase in the internal loss of the oscillation laser light can be further prevented.

Moreover, it is acceptable to provide a layer made of Pd between the second conductive type semiconductor layer group and the layer made of Ag of the electrode. As described above, the layer made of Pd is provided between the second conductive type semiconductor layer group and the layer made of Ag of the electrode, the Pd layer suppresses the reaction between the second conductive type semiconductor layer group and the Ag layer, improving the reliability. Moreover, adhesion between the second conductive type semiconductor layer group and the Ag layer can be improved via the Pd layer.

Moreover, the thickness of the layer made of Pd located between the second conductive type semiconductor layer group and the layer made of Ag of the electrode is about 10 nm, and this allows the thickness of the Pd layer to have a reduced thickness of about 10 nm.

SECOND EMBODIMENT

Figure 7:
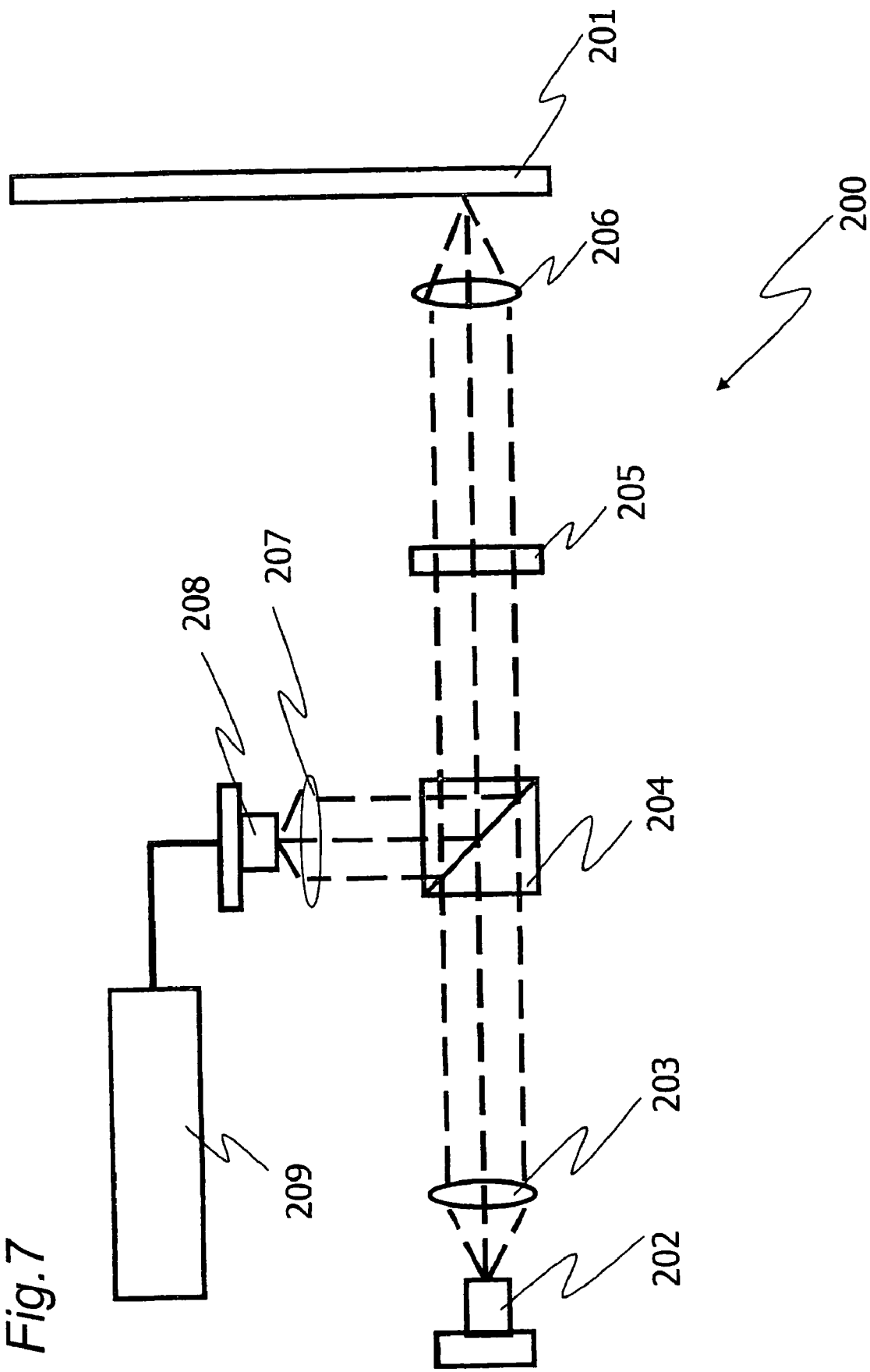
FIG. 7 is a schematic view of an optical disk apparatus of a second embodiment of the present invention.

FIG. 7 shows one example of the structure of an optical disk apparatus 200 according to the present invention. This is used to write data in an optical disk 201 and to reproduce the written data. A semiconductor laser device 202, which is obtained by using the construction of the first embodiment described hereinbefore and adjusting the composition and the layer thickness of the active layer to oscillate in a 780-nm wavelength band, is employed as a light-emitting device to be used in the case.

The optical disk apparatus is described more in detail. During write, a signal light emitted from the semiconductor laser device 202 is formed into parallel light by a collimating lens 203, transmitted through a beam splitter 204, adjusted in the polarization state thereof by a λ/4 polarizer 205, thereafter collected by an object lens 206 and applied to an optical disk 201. During read, laser light modulated with no data signal is applied to the optical disk 201 through the same path as that during write. The laser light is reflected on the surface of the optical disk 201 in which the data are recorded, transmitted through the object lens 206 for applying laser light and the λ/4 polarizer 205, thereafter reflected on a beam splitter 204 to change the angle by 90°, collected by an object lens 207 for a photodetector and made incident on a photodetector 208 for signal detection. The data signal recorded by the intensity of the incident laser light is converted into an electrical signal in the photodetector 208 for signal detection and reproduced into the original signal in a signal light reproduction circuit 209.

The optical disk apparatus of the present second embodiment, which employed the semiconductor laser device 202 capable of being manufactured at low cost, operating with a high oscillation efficiency and possessing a low device resistance, became able to remarkably reduce the power consumption. Therefore, an optical disk apparatus of a smaller load on the environment was able to be provided at low cost.

Although the example, in which the semiconductor laser device 202 having the construction of the first embodiment is applied to the optical disk apparatus of the recording/reproduction type optical disk apparatus, has been herein described, it is needless to say that the apparatus can also be applied to an optical disk recording apparatus and an optical disk reproduction apparatus that use the same 780-nm wavelength band and optical disk apparatuses of other wavelength bands (e.g., 650-nm band).

THIRD EMBODIMENT

Figure 8:
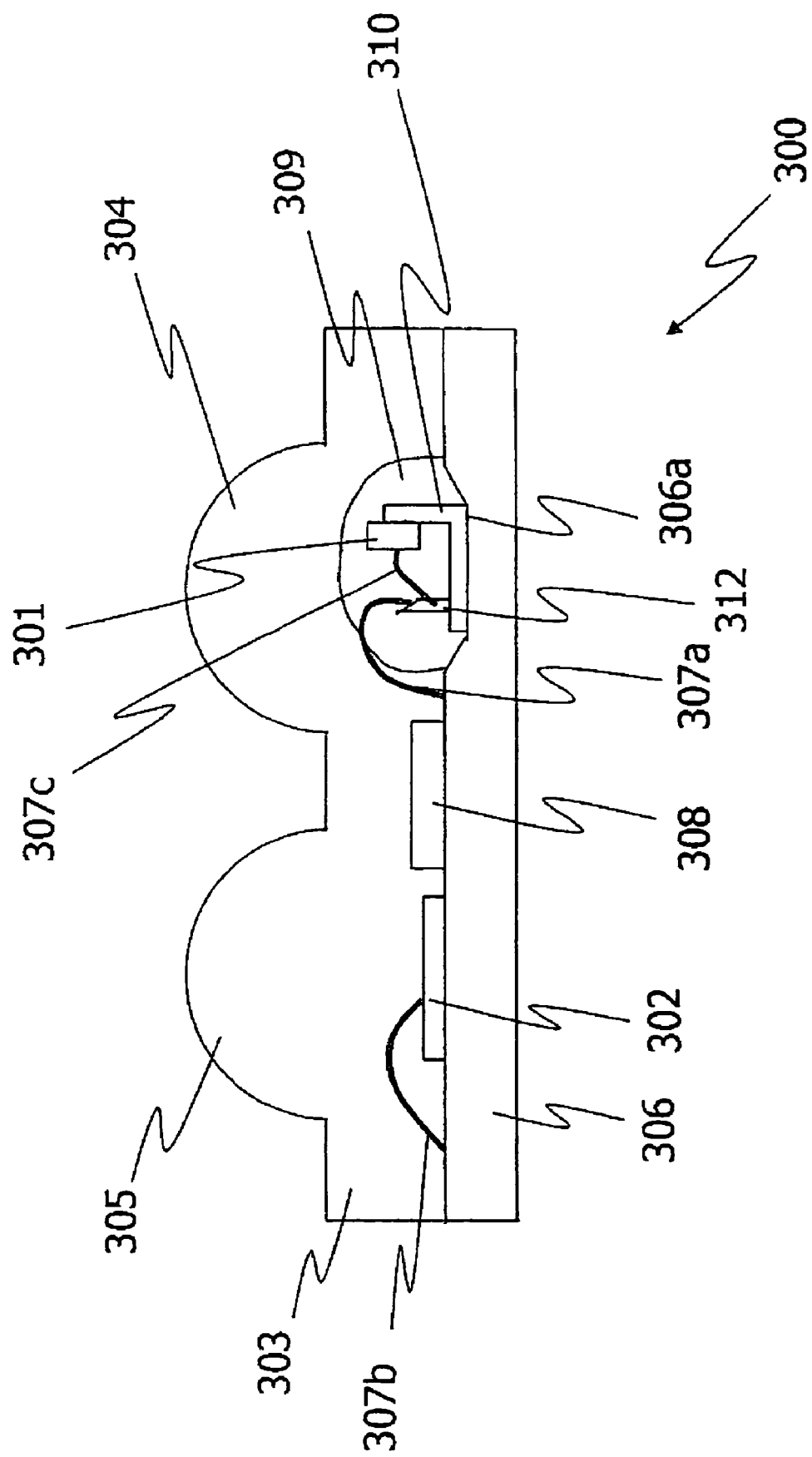
FIG. 8 is a schematic view of an optical transmission module used for an optical transmission system of a third embodiment of the present invention.
Figure 9:
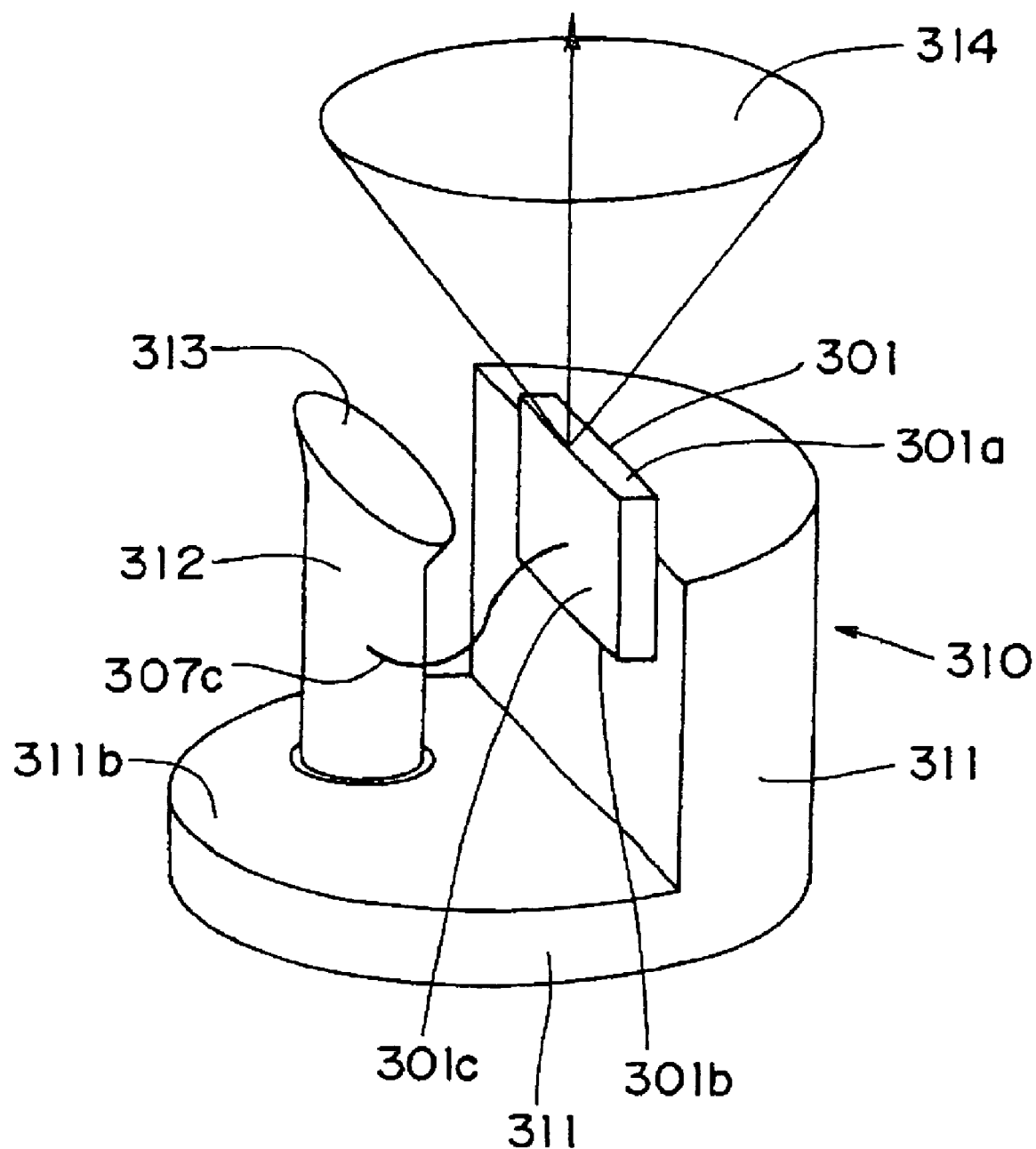
FIG. 9 is a perspective view of a light source according to the optical transmission system of the third embodiment of the present invention.
Figure 10:
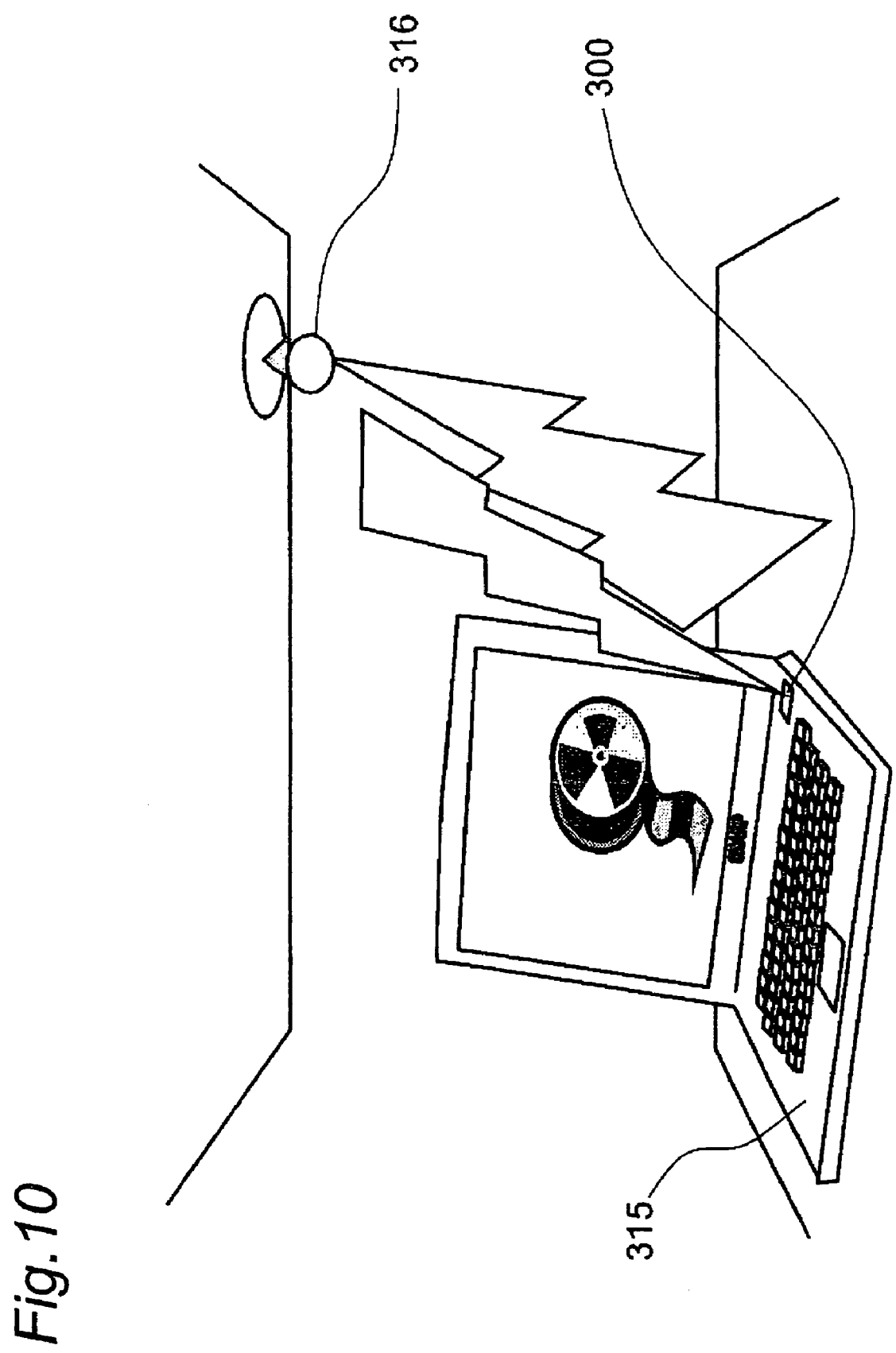
FIG. 10 is a perspective view showing a structural example of the optical transmission system of the third embodiment of the present invention.
Figure 11:
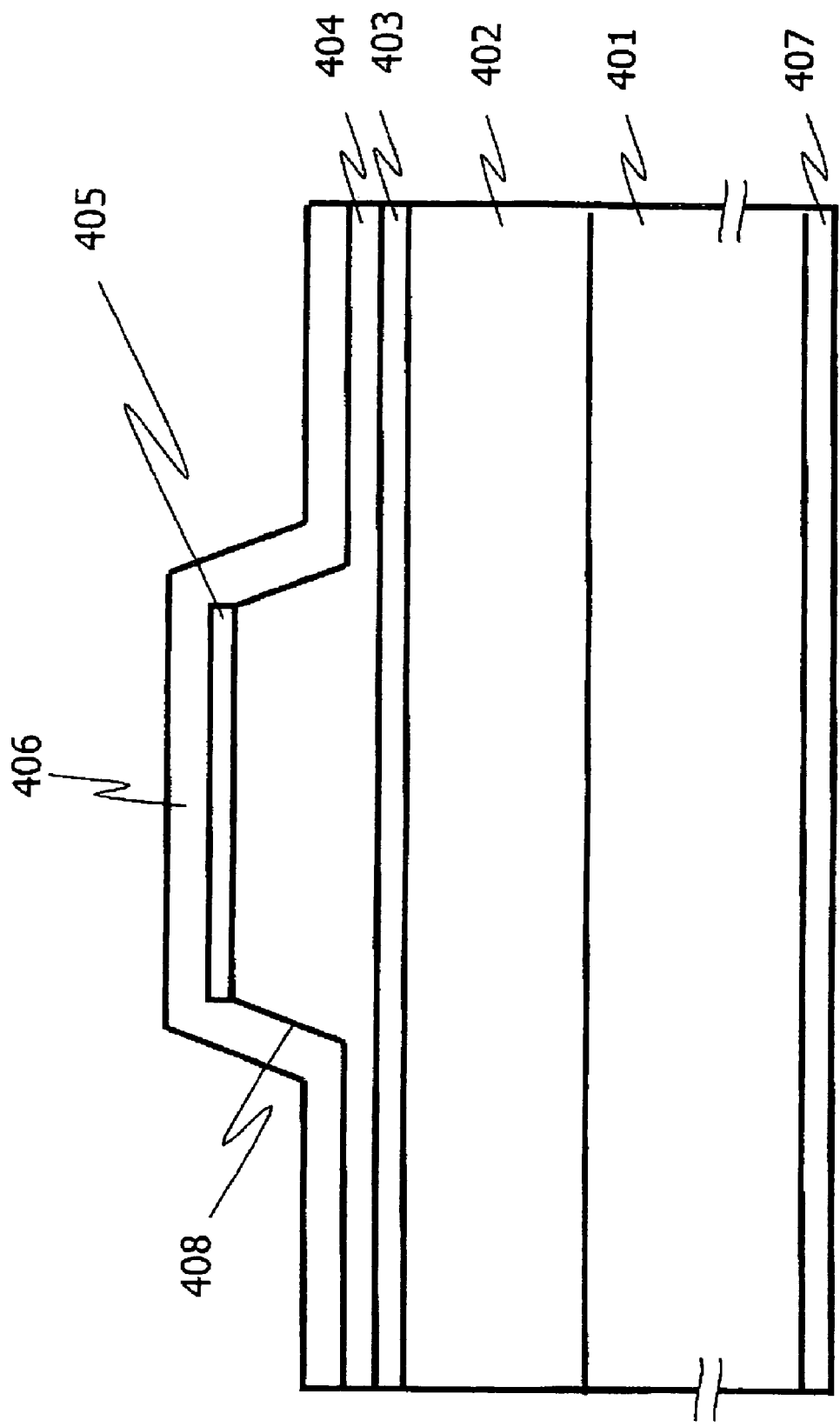
FIG. 11 is a schematic sectional view for explaining a conventional semiconductor laser device and a manufacturing method therefor.

FIG. 8 is a sectional view showing an optical transmission module 300 for use in the optical transmission system of the third embodiment of the present invention. FIG. 9 is a perspective view showing a light source portion. FIG. 10 is a schematic view of the optical transmission system. In the third embodiment, an InGaAs based semiconductor laser element (laser chip) 301 of an emission wavelength of 890 nm described in connection with the first embodiment is employed as a light source, and a pin photodiode made of silicon (Si) is employed as a photodetector 302. Although the detail will be described in detail later, by providing same optical transmission modules 300 on both sides of communications (e.g., a terminal and a server), an optical transmission system that transmits and receives optical signals between both the optical transmission modules 300 is constructed.

In FIG. 8, patterns of both positive and negative electrodes for driving the semiconductor laser are formed on a circuit board 306, and a recess 306a of a depth of 300 μm is provided in a portion on which the laser chip is mounted as illustrated. A laser mount (mount member) 310 on which the laser chip 301 is mounted is fixed to the recess 306a with solder. The positive electrode 312 of the laser mount 310 is electrically connected to a positive electrode portion (not shown) for driving laser on the circuit board 306 via a wire 307a. The recess 306a has a depth such that the emission of the laser light is not disturbed and the surface roughness is configured so as not to exert an influence on the angle of radiation.

The photodetector 302 is also mounted on the circuit board 306, and an electrical signal is taken out via a wire 307b. Besides them, an IC circuit 308 for driving laser/reception signal processing is mounted on the circuit board 306.

Next, liquid silicon resin 309 is dropped by an appropriate quantity to the portion on which the laser mount 310 fixed to the recess with solder is mounted. Filler for diffusing light is mixed in the silicon resin 309. The silicon resin 309 stays in the recess due to surface tension and covers the laser mount 310 fixing the same to the recess 306a. In the third embodiment, the recess 306a is provided and the laser mount 310 is mounted on the circuit board 306. However, since the silicon resin 309 stays on the laser chip surface and its neighborhood due to surface tension, the recess 306a does not always need to be provided.

Subsequently, the resin is heated at a temperature of 80° C. for about five minutes and cured until it is put into a jelly form. Next, coating of a transparent epoxy resin mold 303 is performed. A lens portion 304 for controlling the angle of radiation is formed above the laser chip 301, and a lens portion 305 for collecting the signal light is formed above the photodetector 302, the lens portions being integrated as a mold lens.

Next, the laser mount 310 is described with reference to FIG. 9. As shown in FIG. 9, a laser element 301 is die bonded to an L-figured heat sink 311 with an In paste. The laser chip 301 is the InGaAs based semiconductor laser device described in connection with the first embodiment. A chip lower surface 301b is coated with a high-reflection coating, while a laser chip upper surface 301a is coated with a low-reflection coating. These reflection films concurrently serve to protect the laser chip end surface.

The positive electrode 312 is fixed to a base portion 311b of the heat sink 311 with an insulator so that no electrical continuity is made. The positive electrode 312 and an electrode region 301c provided on the Schottky junction portion of the surface of the laser chip 301 are connected together via a gold wire 307c. As described above, the laser mount 310 is fixed to the negative electrode (not shown) of the circuit board 306 of FIG. 8, and a flat portion 313 in the upper portion of the positive electrode 312 and the positive electrode portion (not shown) of the circuit board 306 are connected together via the wire 307a. With the wiring thus formed, an optical transmission module 300 capable of obtaining a laser beam 314 by oscillation is completed.

The optical transmission module 300 of the third embodiment, which employs the semiconductor laser device that can be manufactured at low cost and has a high efficiency and a low device resistance, is therefore able to suppress the power consumption of the module remarkably lower than in the conventional case and reduce the module unit price. The optical transmission system employing the optical transmission module 300, which operates with low power consumption, is therefore able to reduce the load on the environment and be constructed at low cost. Moreover, when the optical transmission system is mounted on portable equipment, a battery drive time can be made longer than in the conventional case, and the portable equipment can be used more comfortably.

As described above, by providing the same optical transmission modules 300 on both sides of communications, the optical transmission system that transmits and receives optical signals between both the optical transmission modules 300 is constructed. FIG. 10 shows a structural example of the optical transmission system that employs the optical transmission module 300. The optical transmission system includes the optical transmission module 300 provided for a base station 316 installed on the ceiling of a room and the same optical transmission module 300 as described above provided for a personal computer 315. An optical signal emitted with information from the light source of the optical transmission module 300 on the personal computer 315 side is received by the photodetector of the optical transmission module 300 on the base station 316 side. Moreover, an optical signal emitted from the light source of the optical transmission module 300 on the base station 316 side is received by the photodetector of the optical transmission module 300 on the personal computer 315 side. As described above, data communications by light (infrared rays) can be achieved.

It is noted that the semiconductor laser device, the optical disk apparatus and the optical transmission system of the present invention are not limited only to the illustrated examples described above. It is a matter of course that various modifications can be achieved within a range being not departing from the spirit and scope of the present invention with regard to, for example, the layer thicknesses and the number of layers of the well layer and the barrier layer.

The invention claimed is:

1. A semiconductor laser device comprising:
    a first conductive type (n) substrate (101);
    an active layer (106) provided on the first conductive type substrate;
    a second conductive type (p) semiconductor layer group (107-114), which is provided on the active layer (106) and has a stripe-shaped ridge portion (130) in an upper portion;
    the stripe-shaped ridge portion including an upper cladding layer (112), a first contact layer (113), and a second contact layer (114);
    a semiconductor layer (111), included in the second conductive type semiconductor layer group (107-114), where the upper cladding layer (112) is provided on a first portion of the semiconductor layer (111) and the second contact layer (114) is provided above the first portion of the semiconductor layer (111); and an electrode (115), which is put in contact with a side surface of the upper cladding layer (112), a side surface of the first contact layer (113), and a side surface and an upper surface of the second contact layer (114), where part of the electrode is provided on a second portion of the semiconductor layer (111), wherein the electrode comprising a layer made of Ag on a side on which the electrode is put in contact with the second conductive type semiconductor layer group.

2. The semiconductor laser device as claimed in claim 1, wherein the electrode comprises the layer made of Ag, a layer made of a platinum group element or a platinum group element compound and a layer made of Au in order from the side on which the electrode is put in contact with the second conductive type semiconductor layer group.

3. The semiconductor laser device as claimed in claim 1, wherein the electrode is put in contact with both the side surface of the ridge portion of the second conductive type semiconductor layer group and the surface located in the neighborhood of the ridge portion of the second conductive type semiconductor layer group in the region excluding the ridge portion.

4. The semiconductor laser device as claimed in claim 1, wherein the layer made of Ag of the electrode has a thickness of not smaller than 50 nm.

5. The semiconductor laser device as claimed in claim 2, wherein the layer made of the platinum group element or the platinum group element compound constituting the electrode is a layer made of Pd.

6. The semiconductor laser device as claimed in claim 5, wherein an AgPd alloy layer is provided at an interface between the layer made of the Ag and the layer made of the Pd of the electrode.

7. The semiconductor laser device as claimed in claim 5, wherein the layer made of Pd has a thickness of not smaller than 10 nm.

8. The semiconductor laser device as claimed in claim 1, wherein a layer made of Pd is provided between the second conductive type semiconductor layer group and the layer made of Ag of the electrode.

9. The semiconductor laser device as claimed in claim 1, wherein an uppermost portion of the ridge portion of the second conductive type semiconductor layer group is comprised of a heavily doped semiconductor layer of a second conductive type impurity doping concentration of not smaller than $1 \times 10^{18}$ cm$^{-3}$, at least part of the second conductive type semiconductor layer group excluding the uppermost portion of the ridge portion is a lightly doped semiconductor layer of a second conductive type impurity doping concentration of not greater than $1 \times 10^{17}$ cm$^{-3}$, and the electrode is put in contact with the heavily doped semiconductor layer and the lightly doped semiconductor layer in succession.

10. The semiconductor laser device as claimed in claim 9, wherein a second conductive type semiconductor layer having at least an impurity doping concentration of not smaller than $1 \times 10^{17}$ cm$^{-3}$ is formed between the lightly doped semiconductor layer and the active layer.

11. An optical disk apparatus comprising the semiconductor laser device claimed in claim 1.

12. An optical transmission system comprising the semiconductor laser device claimed in claim 1.

13. A semiconductor laser device comprising:

an n-side electrode layer (116);
a substrate (101) provided on the n-side electrode layer;
a buffer layer (102) provided on the substrate;
a first lower cladding layer (103) provided on the buffer layer;
a second lower cladding layer (104) provided on the first lower cladding layer;
a lower guide layer (105) provided on the second lower cladding layer;
an active layer (106) provided on the lower guide layer;
a first upper guide layer (107) provided on the active layer;
a second upper guide layer (108) provided on the first upper guide layer;
a first upper cladding layer (109) provided on the second upper guide layer;
a second upper cladding layer (110) provided on the first upper cladding layer;
a semiconductor layer (111) provided on the second upper cladding layer;
a p-side electrode layer (115) provided on a second portion of the semiconductor layer;
a stripe-shaped ridge portion including a third upper cladding layer (112), a first contact layer (113), and a second contact layer (114), where the second contact layer (114) is provided above a first portion of the semiconductor layer (111), and wherein a side surface of the third upper cladding layer (112) is in contact with the p-side electrode layer (115),
a side surface of the first contact layer (113) is in contact with the p-side electrode layer (115), and
a side surface and an upper surface of the second contact layer (114) are in contact with the p-side electrode layer (115).

* * * * *

UNITED STATES PATENT AND TRADEMARK OFFICE
CERTIFICATE OF CORRECTION

PATENT NO.        : 7,593,442 B2
APPLICATION NO.   : 11/210792
DATED             : September 22, 2009
INVENTOR(S)       : Katsuhiko Kishimoto It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 891 days.

Signed and Sealed this

Twenty-first Day of September, 2010

David J. Kappos
*Director of the United States Patent and Trademark Office*